(12) United States Patent
Yoo et al.

(10) Patent No.: US 7,929,367 B2
(45) Date of Patent: Apr. 19, 2011

(54) LOW POWER MEMORY CONTROL CIRCUITS AND METHODS

(75) Inventors: Seung-Moon Yoo, Santa Clara, CA (US); Myung Chan Choi, San Jose, CA (US); Young Tae Kim, San Jose, CA (US); Sung Ju Son, Santa Clara, CA (US); Sang-Kyun Han, Sunnyvale, CA (US); Sun Hyoung Lee, Seoul (KR)

(73) Assignee: Zmos Technology, Inc., Cupertino, CA (US)

( * ) Notice: Subject to any disclaimer, the term of this patent is extended or adjusted under 35 U.S.C. 154(b) by 0 days.

(21) Appl. No.: 11/534,609

(22) Filed: Sep. 22, 2006

(65) Prior Publication Data

US 2007/0081405 A1   Apr. 12, 2007

Related U.S. Application Data

(60) Provisional application No. 60/720,185, filed on Sep. 23, 2005.

(51) Int. Cl.
*G11C 7/00* (2006.01)
*G11C 5/14* (2006.01)

(52) U.S. Cl. ........ 365/222; 365/205; 365/207; 365/208; 365/189.05; 365/189.09; 365/226

(58) Field of Classification Search .................. 365/205, 365/207, 208, 189.05, 222, 226, 189.09, 365/190, 202
See application file for complete search history.

(56) References Cited

U.S. PATENT DOCUMENTS

| | | | | |
|---|---|---|---|---|
| 5,687,123 A * | 11/1997 | Hidaka et al. | ............ | 365/189.09 |
| 5,696,724 A * | 12/1997 | Koh et al. | ............ | 365/205 |
| 5,805,508 A * | 9/1998 | Tobita | ............ | 365/189.09 |
| 5,814,851 A * | 9/1998 | Suh | ............ | 365/226 |
| 5,889,718 A * | 3/1999 | Kitamoto et al. | ............ | 365/207 |
| 5,991,216 A * | 11/1999 | Raad et al. | ............ | 365/189.09 |
| 6,058,061 A * | 5/2000 | Ooishi | ............ | 365/222 |
| 6,205,068 B1 * | 3/2001 | Yoon | ............ | 365/207 |
| 6,307,773 B1 * | 10/2001 | Smith | ............ | 365/189.05 |
| 6,314,028 B1 * | 11/2001 | Kono | ............ | 365/189.09 |
| 6,337,824 B1 | 1/2002 | Kono et al. | | |
| 6,385,115 B1 * | 5/2002 | Nakai | ............ | 365/226 |
| 6,424,585 B1 * | 7/2002 | Ooishi | ............ | 365/226 |
| 6,452,854 B1 * | 9/2002 | Kato et al. | ............ | 365/226 |
| 6,459,639 B2 * | 10/2002 | Nishimura | ............ | 365/207 |
| 6,501,696 B1 * | 12/2002 | Mnich et al. | ............ | 365/207 |
| 6,535,443 B1 | 3/2003 | Ou Yang et al. | | |
| 6,700,826 B2 | 3/2004 | Ito | | |

(Continued)

FOREIGN PATENT DOCUMENTS

EP   1 164 595 A1   12/2001

(Continued)

*Primary Examiner* — Trong Phan

(74) *Attorney, Agent, or Firm* — John P. O'Banion

(57) ABSTRACT

Circuits and methods for suppressing integrated circuit leakage currents are described. Many of these circuits and methods are particularly well-suited for use in dynamic memory circuits. Examples describe the use of power, ground, or both and power and ground source transistors used for generating virtual voltages. An aspect of the invention describes lowering refresh current. An aspect describes reducing the standby current. An aspect of the invention describes lowering leakage resulting from duplicated circuits, such as row decoders and word line drivers. An aspect describes methods of performing early wake-up of source transistors. A number of source transistor control mechanisms are taught. Circuit layouts methods are taught for optimizing integrated circuit layouts using the source transistors.

60 Claims, 24 Drawing Sheets

U.S. PATENT DOCUMENTS

| | | | |
|---|---|---|---|
| 6,819,600 B2 * | 11/2004 | Sim | 365/207 |
| 6,850,454 B2 * | 2/2005 | Kuge et al. | 365/222 |
| 6,917,551 B2 * | 7/2005 | Jeong | 365/205 |
| 7,002,863 B2 * | 2/2006 | Joo | 365/226 |
| 7,002,864 B2 * | 2/2006 | Kim et al. | 365/207 |
| 7,023,721 B2 * | 4/2006 | Itoh et al. | 365/207 |
| 7,027,334 B2 * | 4/2006 | Ikehashi et al. | 365/207 |
| 7,088,629 B2 * | 8/2006 | Ohsawa | 365/207 |
| 7,209,399 B2 * | 4/2007 | Chun et al. | 365/205 |
| 7,327,627 B2 * | 2/2008 | Kawabata et al. | 365/222 |
| 7,330,388 B1 * | 2/2008 | Chapman et al. | 365/207 |
| 7,345,939 B2 * | 3/2008 | Lee et al. | 365/208 |
| 7,375,999 B2 * | 5/2008 | Vogelsang | 365/207 |
| 7,408,813 B2 * | 8/2008 | Lovett | 365/205 |
| 7,492,654 B2 * | 2/2009 | Won et al. | 365/205 |

FOREIGN PATENT DOCUMENTS

| | | |
|---|---|---|
| KR | 2002 0045959 A | 6/2002 |
| KR | 2003 0000844 A | 1/2003 |

* cited by examiner

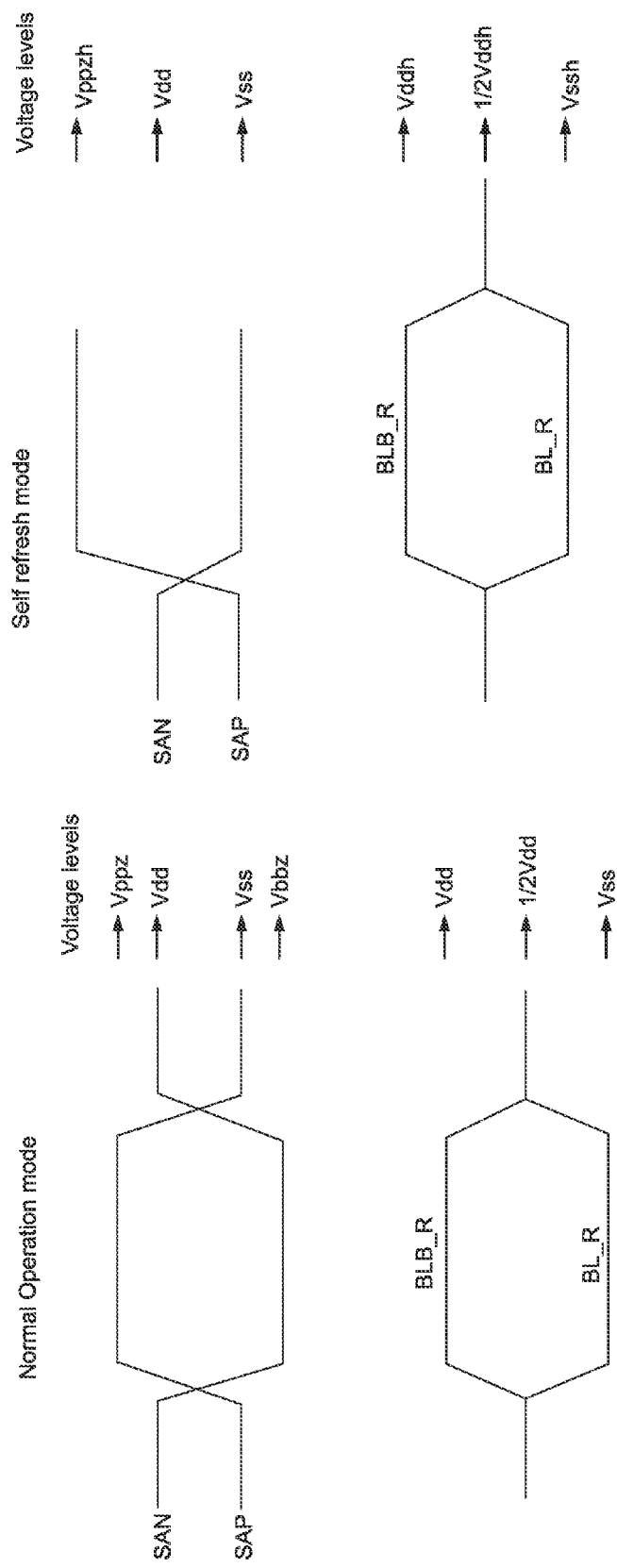

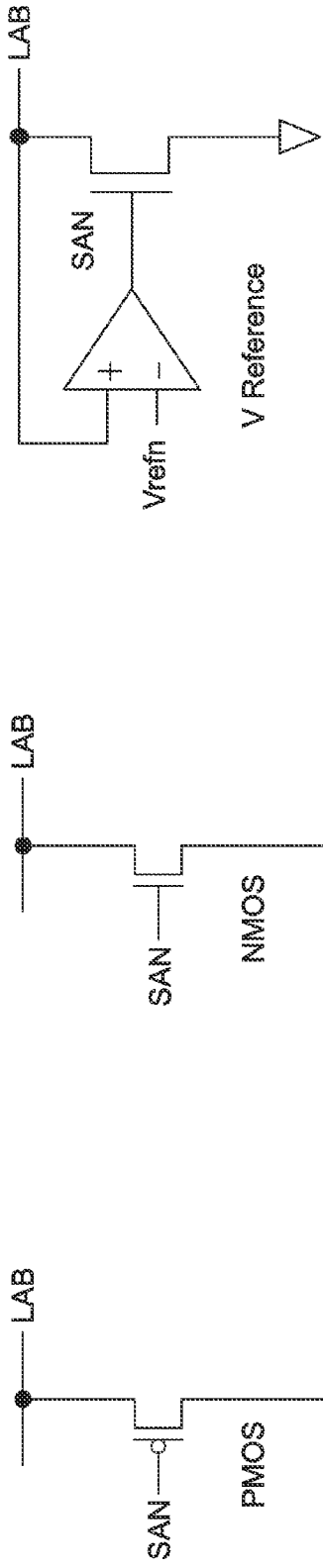
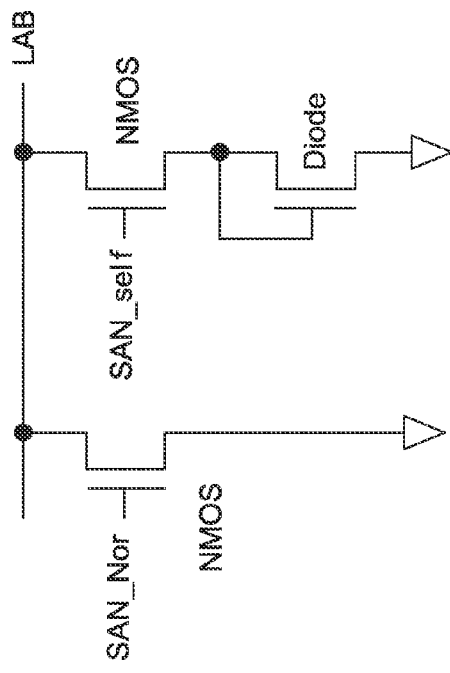
FIG. 4A
FIG. 4B
FIG. 4C
FIG. 4D

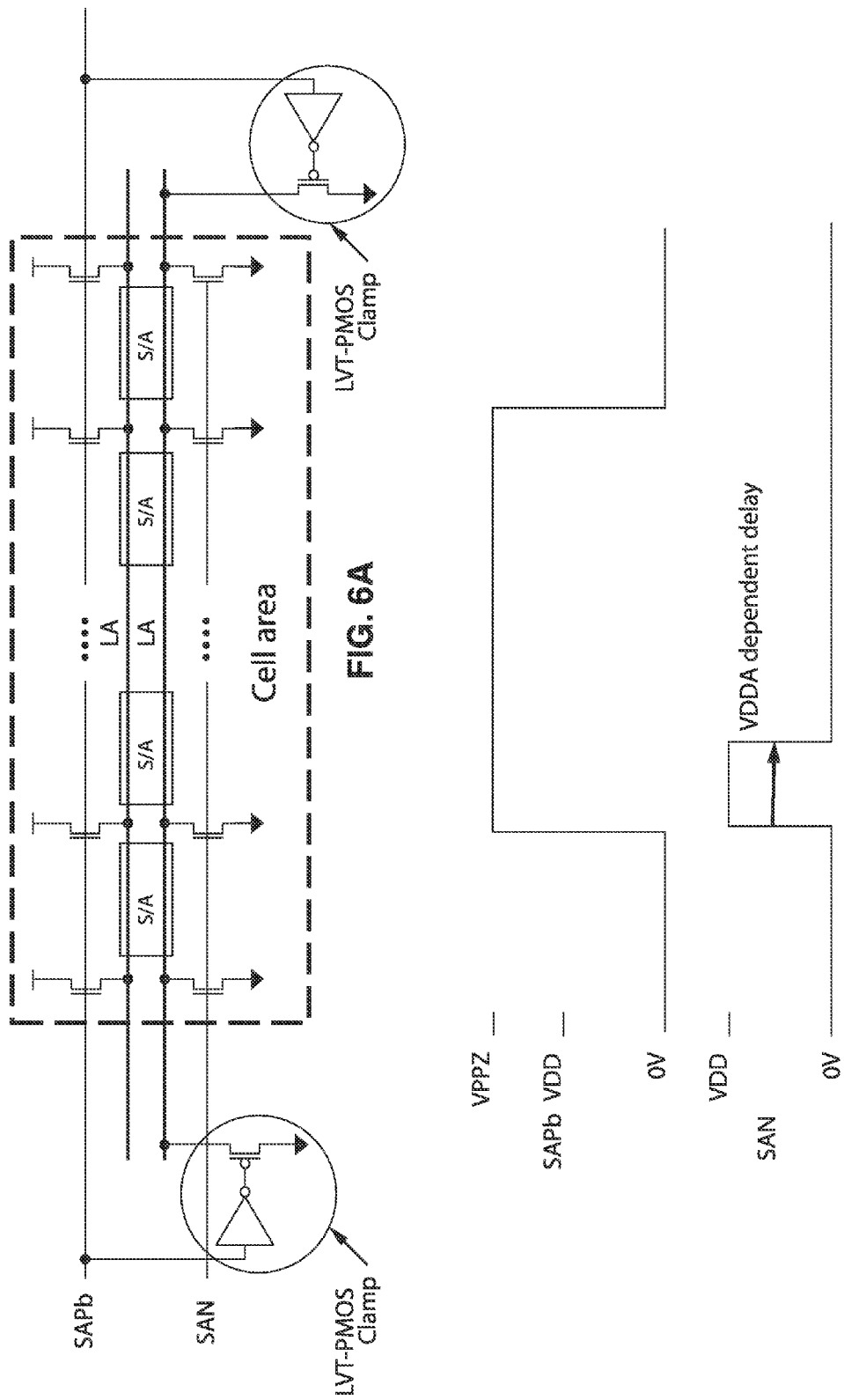

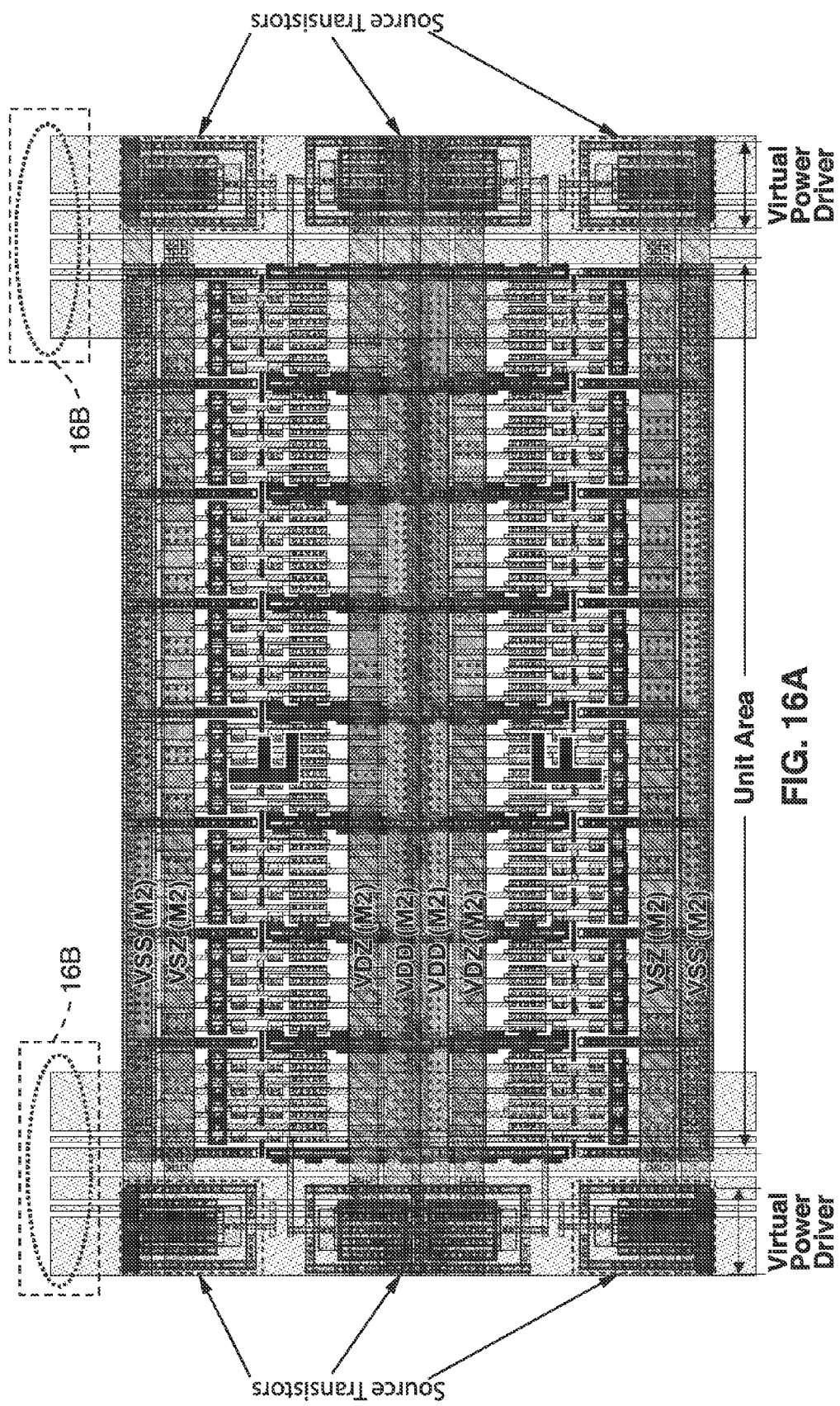

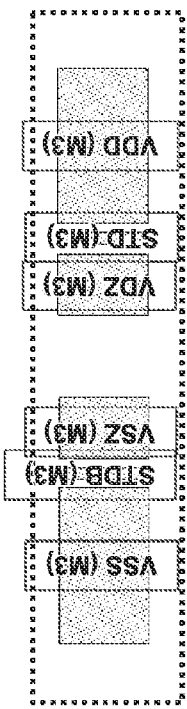
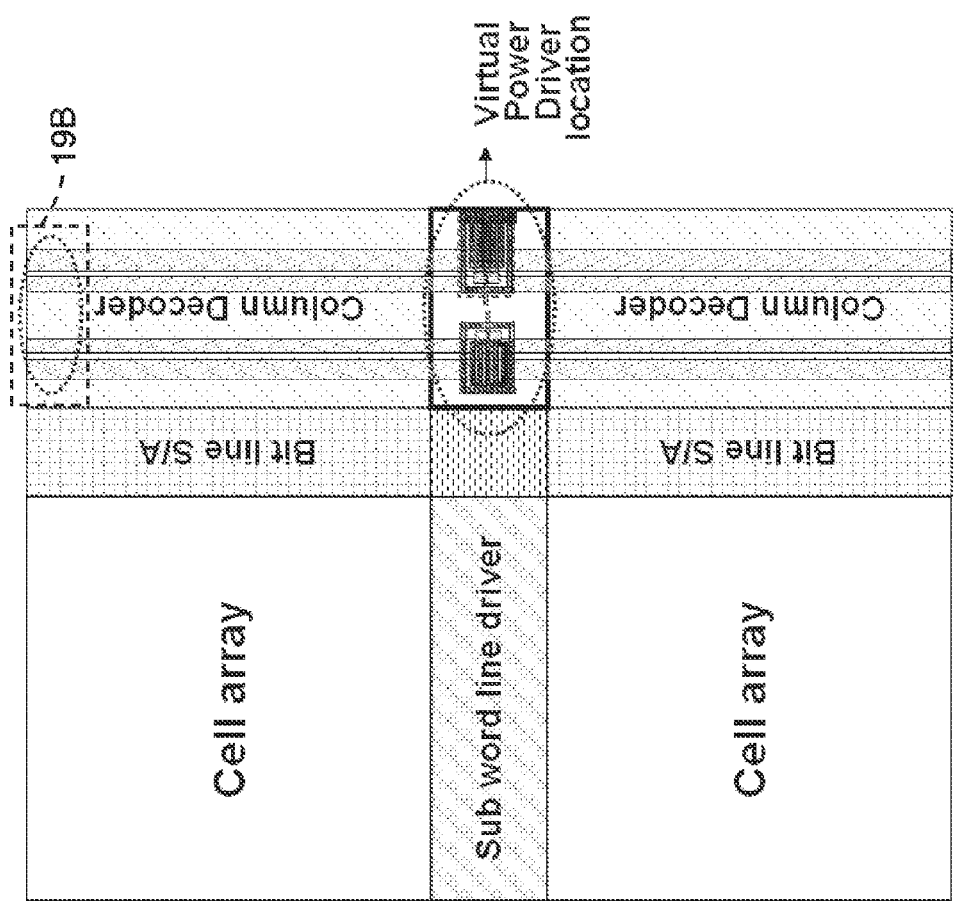
FIG. 19B
FIG. 19A

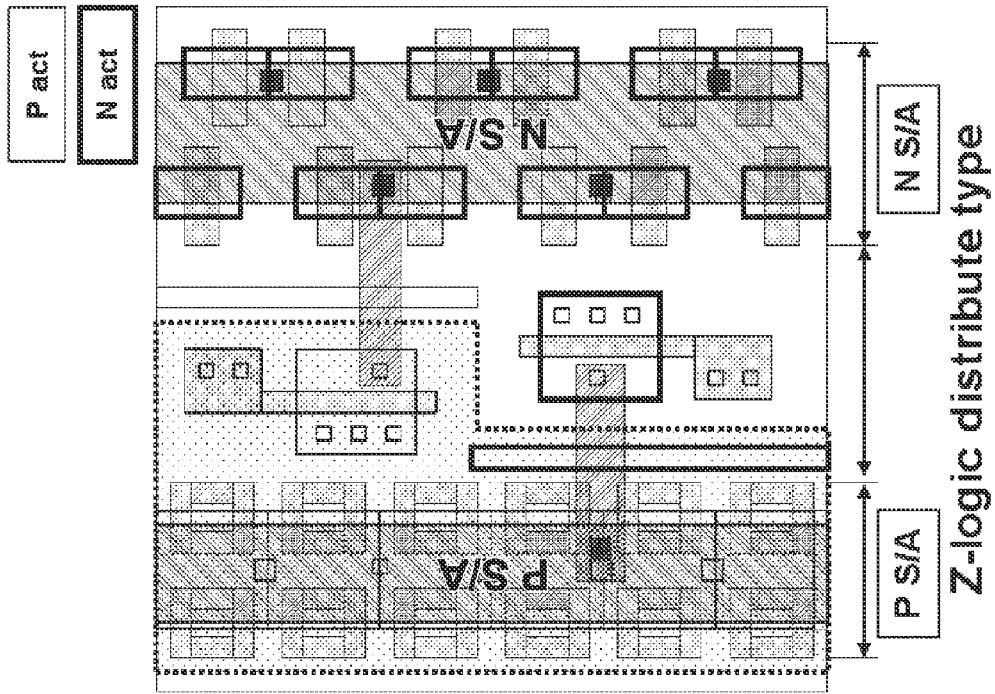
FIG. 22 Z-logic distribute type
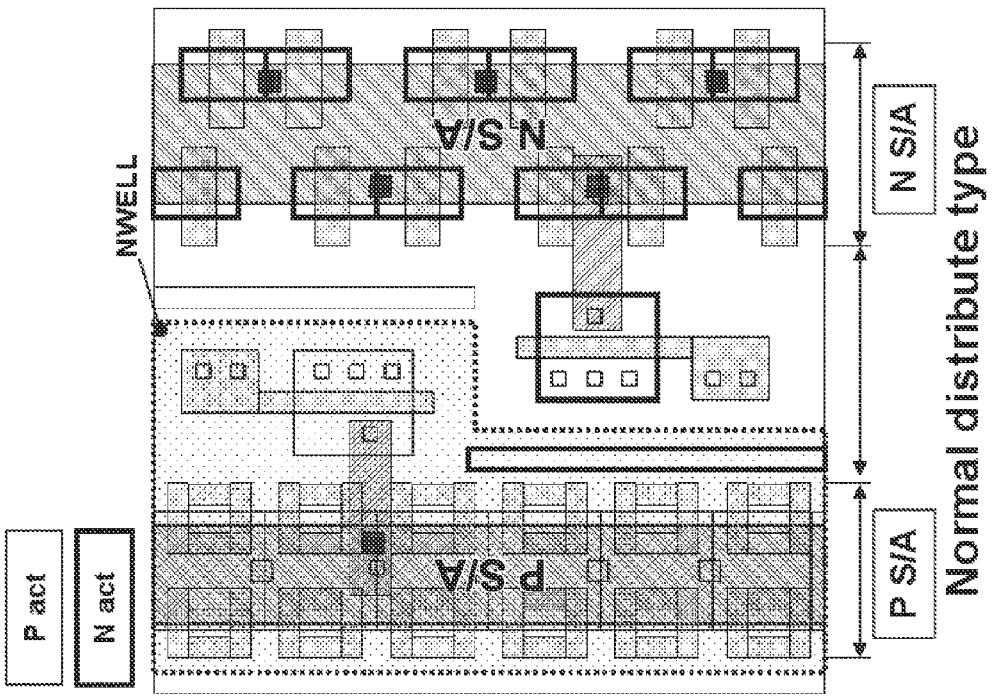
FIG. 21 Normal distribute type

LOW POWER MEMORY CONTROL CIRCUITS AND METHODS

CROSS-REFERENCE TO RELATED APPLICATIONS

This application claims priority from U.S. provisional application Ser. No. 60/720,185 filed on Sep. 23, 2005 incorporated by reference herein in its entirety.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to memory devices, and more particularly to control circuits within memory devices.

2. Description of Related Art

Memory devices as well as many other electronic circuits incorporate memory cells within which are retained bits of digital data. These memory cells can be static or dynamic in nature. In dynamic random access memory (DRAM) the memory cells are so volatile that a charge restoring operation is needed to maintain cell information. This charge-restoration operation is referred to as a refresh operation, such as performed by a memory controller. Depletion of the charge from the memory cell arises through several leakage sources. A major portion of the leakage arises from a sub-threshold leakage current which constitutes a major portion of the total leakage current. In a conventional DRAM cell organization which shares a bitline among many memory cells, the shortest data retention time arises during memory block activation.

Accordingly, a need exists for circuits and methods for reducing leakage current within memory circuits, and in particular dynamic memory circuits. These needs and others are met within the present invention, which overcomes the deficiencies of previously developed circuits and methods.

BRIEF SUMMARY OF THE INVENTION

A number of circuits and methods are taught for reducing power consumption within memory circuits, and in particular dynamic memory circuits. A dynamic memory circuit includes a first cross-coupled transistor pair for sensing and amplifying a differential voltage between a first and second circuit nodes, herein referred to as LA and LAb. In response to sensing the differential voltage either said first or second circuit node is driven to a first voltage. The node to which this arises is the circuit node which is closest in voltage to the first voltage.

The invention is amenable to being embodied in a number of ways, including but not limited to the following descriptions.

An embodiment of the invention can be generally described as a circuit device, comprising: (a) a memory cell; (b) at least one memory access transistor coupled to the memory; and (c) wherein the memory access transistor is configured with a gate-to-source potential that changes in response to the operating mode of the circuit device.

The circuit and method of reducing power consumption is particularly well suited for dynamic random access memory (DRAM) in which memory state is maintained within a plurality of DRAM memory cells in response to performing refresh operations.

Within the circuit, the gate-to-source potential of the memory cell comprises a source potential which is higher than the gate potential, for example, the source potential can be higher than zero volts, or the gate potential lower than zero volts, or the source potential can be higher than zero volts and the gate potential also lower than zero volts.

In one implementation, a circuit is configured for changing the gate-to-source potential in response to reading the state of data within the memory cell. By way of example, the circuit can comprise a bitline sense amplifier configured for controlling the source transistors. The circuit may comprise a latch device (i.e., CMOS) and a source transistor, which can be a power source transistor, ground source transistor, or a combination of source and ground transistors.

The present aspects of the invention can be implemented using different forms of source transistors. By way of example, a PMOS transistor can be used as a ground source transistor which changes the gate-to-source potential in response to reading the state of data within the memory cell. In one embodiment, the source of the PMOS transistor is coupled to the common node of two NMOS transistors of a CMOS latch, and the drain of the PMOS transistor is connected to ground. In this example, the gate potential of the PMOS transistor changes in response to operating mode of the memory device. The gate potential of the PMOS transistor is preferably controlled in response to receiving a pulsed signal, although other drive signals can be utilized.

The source transistors can be modulated in response to memory operating mode. For example, for a dynamic memory cell is configured so that the gate potential of the PMOS transistor is lower than zero volts in normal operating mode, and the gate potential is zero volts when the device is in refresh mode. The refresh mode can be controlled by a memory controller or memory device, or similar circuit.

Source transistors can comprise various arrangements of NMOS and PMOS transistors. In one example, an NMOS source transistor can be used as a ground source transistor which changes the gate-to-source potential in response to reading the state of data within the memory cell. In one implementation the drain of the NMOS source transistor is coupled to a common node of two NMOS transistors of a CMOS latch, and the source of the NMOS source transistor is connected to ground. In this case the NMOS source transistor gate potential changes in response to the operating mode of the circuit device. The gate potential of this NMOS source transistor is preferably controlled by a pulse signal, or by a reference voltage through an error detector, or other circuit which is responsive to device state.

An embodiment of the invention describes a dynamic memory (DRAM) device with improved memory retention, comprising: (a) a plurality of memory cells; (b) a pair of bitlines coupled to the memory cells; (c) wherein the memory cells are configured to maintain memory state in response to performing refresh operations; and (d) wherein the memory cells are configured with a cell data high potential which is boosted in self-refresh, or system controlled, refresh mode.

In one implementation, the equalized bitline level is higher in self-refresh mode than in normal operating mode, such as by being controlled by a bitline precharge level generator. The boosted potential of the bitline level can be controlled by a reference voltage signal through an error detector, a pulse signal, a combination of existing signals, or a combination of reference voltage signal, pulse signal, and mode entry and/or exit signals. Cell data high potential can be generated by using source transistors, such as comprising at least a first, second and third source transistor. For example, the first source transistor comprising a PMOS source transistor, and the second and third source transistors comprising NMOS source transistors.

In one example, the first transistor is configured for speeding up supply power, and is preferably connected to a power supply with a higher voltage potential than the supply voltage of second and third source transistors. The second source transistor in this example generates main power and the third source transistor generates auxiliary power. The source of first PMOS source transistor and the drain of first NMOS source transistor are preferably connected to internally generated power, and the drain of the second NMOS source transistor is connected to externally supplied power. The gate of the second NMOS source transistor can be controlled by a pulse or a combination of pulse and mode entry and/or exit signals. The second NMOS source transistor is configured to provide a turn-on time in self-refresh mode that exceeds the turn-on time in normal operating mode.

An embodiment of the invention describes a dynamic memory (DRAM) device, comprising: (a) a plurality of memory cells; (b) wherein memory state of the dynamic memory is maintained in response to performing refresh operations; (c) a pair of bitlines coupled to the memory cells; (d) a bitline sense amplifier coupled to the bitlines for sensing the state of memory cells; (e) a plurality of source transistors coupled to the bitline sense amplifier; (f) the plurality of source transistors preferably comprises a first PMOS source transistor, a first second NMOS source transistor; wherein the source transistors are connected to a latch within the bitline sense amplifier.

According to one implementation, the source of the first PMOS source transistor, and the drain of the first NMOS source transistor, are connected to internally generated power, and the drain of the second NMOS source transistor is connected to externally supplied power. The gate of second NMOS source transistor can be controlled in a number of ways, such as by a pulse, or a combination of pulse and mode entry and/or exit signals.

An embodiment of the invention describes a dynamic memory (DRAM) device, comprising: (a) a plurality of memory cells whose memory state is maintained in response to performing refresh operations; (b) a pair of bitlines coupled to the memory cells; (c) a bitline sense amplifier coupled to the bitlines for sensing the state of the memory cells; and (d) a plurality of source transistors coupled to the bitline sense amplifier and configured to increase the voltage potential of memory cell high data.

By way of example, the plurality of source transistors can comprise three source transistors. In one case the source transistors comprise a first PMOS source transistor, and a first and second NMOS source transistor. The source transistors are connected to a latch within the bitline sense amplifier. A first of the plurality of source transistors is used to speed up supply power by being connected to a power supply configured with a higher voltage potential than the supply voltage of a second source transistor and a third source transistor within the plurality of source transistors. In this case the second source transistor can be configured to deliver main power, and the third source transistor to deliver auxiliary power.

An embodiment describes a method of reducing current in a dynamic memory circuit, comprising: (a) coupling at least one source transistor to the sense amplifiers of the dynamic memory circuit for operation from virtual power supplies; (b) suspending read and/or write accesses to a memory block to enter active-standby mode in response to receiving an associated signal; and (c) changing the state of the source transistors while maintaining data in the memory cell to reduce operating current of the memory block.

In one implementation the source transistors comprise at least one power source transistor, at least one ground source transistor, or a combination of power and ground source transistors. The source transistors are controlled in response to device signals, such as receiving a pulse signal, or a reference voltage received through an error detector, or mode entry and/or exit signals, or a combination of pulse, reference voltage, or mode entry and/or exit signals. Changing the state of the source transistors lowers the voltage supplied to the bitline latch in active standby mode.

The source transistors can be configured in different ways. In one case the source transistor comprises at least one NMOS source transistor, or at least one PMOS source transistor, or a combination of NMOS and PMOS source transistors. For example, the source transistor can comprise at least one NMOS power source transistor configured with a gate potential that is lower when the dynamic memory circuit is in active standby mode than when the dynamic memory circuit is in normal operating mode. The source transistor can comprise at least a ground source transistor which supplies ground voltage to the bitline latch wherein the ground voltage has a higher potential in active standby mode than in normal operating mode in response to controlling the state of the ground source transistor. The ground source transistor can comprise NMOS source transistors, PMOS source transistors, or both NMOS and PMOS source transistors.

An embodiment of the present invention describes a method of reducing current in a dynamic memory circuit, comprising: (a) coupling at least one source transistor to the sense amplifier of the dynamic memory circuit to configure it for operation from a virtual power supply; and (b) changing the state of the at least one source transistor to reduce operating current of the memory block while maintaining data in the memory cell; (c) receiving an asynchronous signal (i.e., command signal) with positive setup time relative to a first clock, or a synchronous signal reference to a second clock with a positive setup time relative to the first clock, to change the state of the source transistor(s). In one case the second clock and the first clock operate at an identical frequency, while having a differing phase relationship. In another case the second clock and the first clock operate at different frequencies.

In one implementation of this method the source transistors comprise power source transistors, for example, as a combination of NMOS and/or PMOS source transistors. By way of example, two or more asynchronous signals can control the power source transistors, with the earlier asynchronous signal being applied to the gate of the PMOS source transistor. The asynchronous signal that enables the NMOS source transistor has a voltage potential that exceeds the power potential.

In one implementation of this method the source transistors comprise ground source transistors, for example a combination of NMOS and/or PMOS transistors. For example, the source transistors can comprise ground source transistors. Two or more asynchronous signals control the ground source transistors and the earlier asynchronous signal is applied to the gate of the NMOS source transistor and the later signal applied to the PMOS transistor. The asynchronous signal that enables the PMOS source transistor has a voltage potential below that of ground potential.

Other implementations are also described, such as the control of power source transistors and ground source transistors using synchronous signals, or a combination of asynchronous and synchronous signals.

An embodiment describes a method of reducing current in a dynamic memory circuit, comprising: (a) coupling at least one source transistor to the sense amplifier of the dynamic memory circuit to configure it for operation from a virtual power supply; and (b) changing the state of the at least one source transistor to reduce operating current of the memory block while maintaining data in the memory cell; (c) wherein the state of the source transistor is changed in response to receiving an asynchronous signal with positive setup time relative to a clock and a synchronous signal (i.e., command) referenced to the same clock.

In addition, the dynamic memory circuit can be logically or physically divided into sections in which source transistors of a first portion of these sections are controlled by an asynchronous signal and source transistors of a second portion of the sections are controlled by a synchronous signal. Different combinations are described of synchronous and asynchronous control as well as the transistor being used.

An embodiment describes a integrated circuit, comprising: (a) at least one block of memory cells containing a plurality of logic transistors; (b) at least one power path and at least one ground path bordering the block of memory cells; (c) a row decoder coupled to each block of memory cells within the at least one block of memory cells; (d) a column decoder coupled to each block of memory cells within the at least one block of memory cells; (e) at least a pair of bitlines coupled to each memory cell of the at least one block of memory cells; (f) a bit line sense amplifier coupled to the pair of bit lines and configured for sensing differential voltage of a memory cell within the memory cells and refreshing the high or low state of the memory cell; (g) at least one source transistor within the plurality of logic transistors of the memory block which is configured for generating at least one virtual voltage level; and (h) at least one virtual power path, virtual ground path, or combination of virtual power and ground paths coupled to the at least one virtual voltage level.

In the layout of this integrated circuit at least one source transistor can be placed closer to its respective power or ground line than the logic transistors. The source transistor can comprise a power source transistor, a ground source transistor, or a combination of power and ground source transistors. In one case the power source transistor includes an NMOS source transistor, or the ground source transistor includes a PMOS source transistor, or both power and ground source transistors can be included.

The source transistors can be positioned outside of the memory block, which is composed of logic transistors. An embodiment describes an integrated circuit in which the source transistor is positioned under the power line and does not cross the plurality of logic transistors of the block of memory cells. Implementations describe source transistor placement comprising a lumped placement of source transistors for the entire logic block, or a distributed placement where power and source transistors are adjacent to each layout block. The source transistors can comprise any combination of power source transistors and ground source transistors which drive the entire layout block. Alternatively, the block of memory cells can be segmented and power and/or ground source transistors placed per each segment.

The source transistors can generate a potential on a virtual power line, such as one that is positioned closer to the logic transistors of the memory cells than to one or more power lines of the integrated circuit. In one implementation the source transistors are positioned in the gap between a pair of column decoders at the intersection of a sub-wordline driver, or by strapping. In other implementations source transistors are positioned in the gap between row decoders, such as at the intersection with a bitline sense amplifier. The source transistor can be positioned in the gap between a first and second sub-wordline driver at the intersection with a bitline sense amplifier. Source transistors can comprise a PMOS source transistor placed in an NWELL of a cross-coupled pair of PMOS transistors within a latch of the bit line sense amplifier, or the source transistor can comprise an NMOS power source transistor placed in a PWELL, or on a portion of P-type substrate. The source transistors can be placed on each pair of bitlines or a group of bitline pairs.

An embodiment of the invention describes a method of determining proper source transistor connection within a memory or logic circuit, comprising: (a) executing a simulation routine for characterizing the memory or logic circuit; (b) assigning a known state, other than $V_{DD}$ or $V_{SS}$, to the node where a source transistor connects to the logic transistor during the simulation, wherein the known state is output at the logic output for a predetermined input state.

An aspect of the invention is reducing leakage current in memory circuits, and in particular dynamic memory circuits subject to refresh.

Another aspect of the invention is the incorporation of various source transistor configurations for providing virtual source and virtual ground potentials to provide power for portions of the circuit in response to operating mode.

Another aspect of the invention is that of reducing standby currents, such as active power-down standby (ICC3P), by incorporating select source transistor configurations.

Another aspect of the invention is to reduce leakage that arises from duplicated circuits, such as row decoders, wordline drivers and so forth, wherein these circuits are deactivated after storing state information that is utilized to reload the circuits upon reactivation.

Another aspect of the invention is to provide different circuits for controlling source transistors to drive virtual power lines.

Another aspect of the invention provides layout methods for enhancing the use of power source transistors while minimizing the chip area used.

A still further aspect of the invention is a method of verifying source transistor use during integrated circuit design and layout.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIGS. 2A-2B are timing diagrams of normal operation and self-refresh modes for the circuit of FIG. 1.

FIGS. 4A-4D are schematics of circuits for controlling ground levels within the memory circuit according to the present invention.

FIG. 6A is a schematic of a ground level control method according to an aspect of the present invention, showing an NMOS only SAN controller with a clamp (LVT-PMOS) between LAb and ground.

FIG. 6B is a timing diagram for the ground level control method as illustrated in FIG. 6A.

FIGS. 16A-16B is a layout for a circuit block comprising a plurality of the unit blocks shown in FIG. 15.

FIGS. 19A-19B is a layout for a z-logic column decoder according to an aspect of the present invention, showing virtual power drivers located in decoder holes.

FIG. 21 is a layout of N and P sense amplifier transistors within a normal distribution type.

FIG. 22 is a layout of N and P sense amplifier transistors within a z-logic distribution type according to an aspect of the present invention.

DETAILED DESCRIPTION OF THE INVENTION

Referring more specifically to the drawings, for illustrative purposes the present invention is embodied in the apparatus generally shown in FIG. 1 through FIG. 27. It will be appreciated that the apparatus may vary as to configuration and as to details of the parts, and that the method may vary as to the specific steps and sequence, without departing from the basic concepts as disclosed herein.

1. Methods to Reduce Self-Refresh Current.

Figure 1:
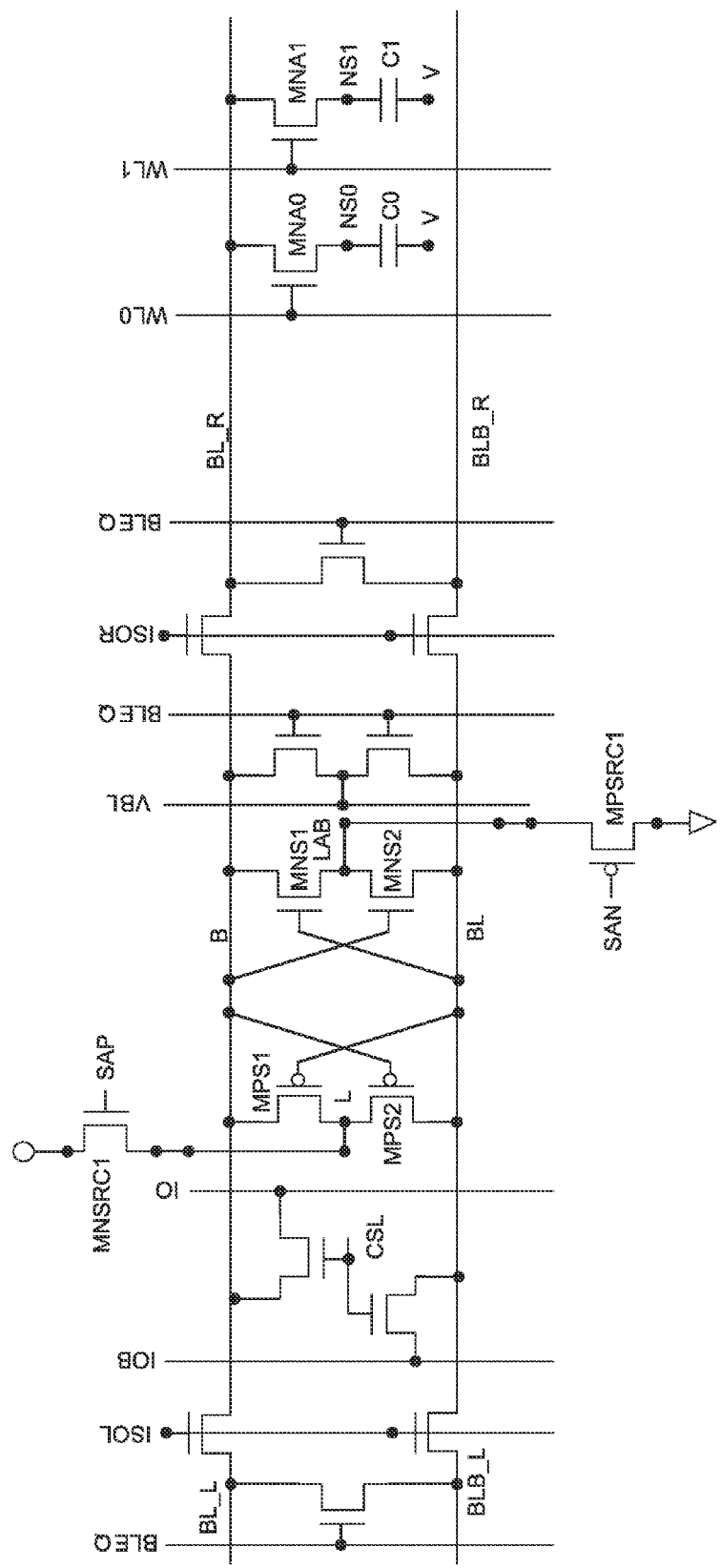
FIG. 1 is a schematic of a dynamic random access memory (DRAM) core according to an embodiment of the present invention, shown for reducing self-refresh current.

FIG. 1 depicts a dynamic memory circuit whose signals will be recognized by those of ordinary skill in the art. Data bits are stored on capacitors, two of which are represented as C0 and C1, with nodes NS0 and NS1 over voltage V. The memory state of these bits are read through access transistors, here represented as MNA0 and MNA1, when the transistors are activated by the word lines, shown as WL0 and WL1. VBL represents initial voltage. Bit line B and its complement BL couple the sense amplifier on the left to the cells of the dynamic RAM on the right side. The bit line is divided into left bit line BL_L, with its complement BLB_L, with BL_R and BLB_R on the right side. Bit line equalization signals BLEQ are seen on both the left and right sides of the bit line halves. Isolation control signals for the left and right sides of the bit lines are shown as ISOL and ISOR. A chip select CSL on the left side of the bit lines is seen. The common source node signals SAP is shown controlling transistor MNSRC1 with SAN controlling transistor MPSRC1 as shown. A sense amplifier and latch are shown with nodes L and LAB implemented with transistors MPS1, MPS2, MNS1 and MNS2. State of the memory bits are output through line 10 and its complement 10B.

FIG. 1 illustrates by way of example embodiment a dynamic memory core according to the present invention. During the memory precharge state, bitline pairs (BL_R, BLB_R, BL_L, and BLB_L) are typically at a voltage potential which is about half of $V_{DD}$ potential, where $V_{DD}$ is the memory core operating voltage. It is assumed that data low and high are stored at memory storage nodes NS0 and NS1, respectively. In precharge state, wordlines such as WL0 and WL1 are set to ground (zero) potential. Therefore, $V_{DS}$ and $V_{GD}$ of transistor MNA1 (memory cell access transistor for storage node NS1) are at $-\frac{1}{2} *V_{DD}$ and $-V_{DD}$, respectively.

Thus, the leakage current flowing through memory cell transistor MNA1 is meager and the high data stored at the memory cell node NS1 is not significantly deteriorated.

However, when memory cell C0 is accessed, a significant leakage current path for MNA1 is formed. After wordline WL0 is activated and charge between memory cell C0 and bitline BL_R is shared, the bitline sense amplifier pairs consisting of MPS1, MPS2, MNS1 and MNS2 detect and amplify the developed signal difference at bitline pair BL and BLB. As a consequence of the data stored at memory cell C0 being low, BL_R goes to low ($V_{SS}$) and BLB_R goes to high ($V_{DD}$). At this point, while $V_{GD}$ of MNA1 is still $-V_{DD}$, $V_{GS}$ of MNA1 is zero instead of $-\frac{1}{2} *V_{DD}$ as in the precharge state. Due to the absence of reverse bias condition for $V_{GS}$ of MNA1, the leakage current through MNA1 increases significantly and therefore, data retention time for stored high data at NS1 can be subject to drastic reduction. This leakage current represents a serious problem in DRAM operation modes, such as self-refresh mode, because the DRAM cell refresh period is determined purely based on how long the data can be stored at a memory cell and the longer the refresh period the smaller the refresh current. This self-refresh current therefore is an important parameter for low power devices such as mobile application devices.

Circuits and methods are described herein which suppress leakage current in memory cells that are not being accessed. It should be appreciated that the voltage levels described are provided by way of example for one particular embodiment, wherein one of ordinary skill in the art will appreciate that the circuits and methods can be implemented to support any desired voltage potential for the power line.

In a first method, the wordline level is maintained at a slightly lower voltage than zero. For example, in a precharge state, the wordline level is set to −0.3V instead of 0V. When a memory cell is accessed, even though the bitline voltage is developed to $V_{SS}$, the $V_{GS}$ of memory access transistors which are not accessed is not 0V, but is −0.3V. One disadvantage of this method is the requirement of a negative voltage in self-refresh mode and the difficulty in achieving a lower voltage such as −0.6V to further suppress leakage current in self-refresh mode.

In a second method, a developed bitline level is boosted while maintaining the wordline voltage to be zero so that $V_{GS}$ of the memory access transistor is a negative value. One way to achieve this is to discharge the bitline to a voltage higher than 0V, instead of discharging to $V_{SS}$. For example, when the memory array is accessed, the bitline BL_R is discharged to 0.3V instead of to $V_{SS}$ which is normally at 0V. Therefore, even though the wordline level of an un-accessed memory cell is zero, $V_{GS}$ of the corresponding memory access transistor is −0.3V.

Clamping of the bitline voltage can be achieved by any suitable means, one such mechanism is represented in FIG. 1. Instead of using a typical NMOS transistor for an NMOS source control transistor, a PMOS transistor, such as MPSRC1, can be utilized. By way of example, and not limitation, one control method for the PMOS source transistor can be implemented as follows. In normal operation, SAN is lowered to a negative voltage to overcome a PMOS $V_T$ drop. Since a voltage lower than $V_{SS}$ by a PMOS threshold voltage is required to fully transfer $V_{SS}$, the voltage level of SAN is at most $V_{SS}$-$V_{TP}$ for a full $V_{SS}$ transfer. However, in self-refresh mode, SAN goes to $V_{SS}$ instead of going to a negative voltage to clamp the BL_R level at $V_{TP}$ of MPSRC1. Under this condition in self-refresh mode, $V_{GS}$ of MNA1 is a negative value and suppresses leakage current.

A disadvantage of boosting the developed bitline level is slower sensing speed of the sense amplifier. For example, assume that the bitline pairs are set to half $V_{DD}$ (1V) and node LAb is boosted by a certain voltage (0.3V) instead of its normal value of 0V. Without boosting, $V_{GS}$ of MNS1 can be $\frac{1}{2}*V_{DD}$ (1V) when a sensing operation starts, but with boosting it can only be 0.7V. As such, the reduced current capability of the sensing transistor can degrade the sensing speed. To overcome this shortcoming, a novel power boosting scheme is disclosed herein. In normal operation, the DRAM core voltages are $V_{DD}$ and $V_{SS}$. In self-refresh mode, the DRAM core voltages are $V_{DDH}$ and $V_{SSH}$, where $V_{DDH}$ and $V_{SSH}$ are power and ground voltages boosted by a certain amount, respectively.

FIGS. 2A-2B illustrate timing diagrams to implement the above power boosting method based on the DRAM core configuration presented in FIG. 1. In normal operation as shown in FIG. 2A, SAP goes to $V_{PPZ}$ from $V_{SS}$, where $V_{PPZ}$ is a predetermined voltage higher than $V_{DD}$ to overcome a threshold voltage drop by NMOS transistor. SAN goes to $V_{BBZ}$ from $V_{DD}$, where $V_{BBZ}$ is a predetermined voltage lower than $V_{SS}$ to overcome a threshold voltage drop by PMOS transistor. Therefore, bitline pairs are fully developed to $V_{DD}$ and $V_{SS}$. Assuming data low is stored at cell C0, BL_R goes to $V_{SS}$ and BLB_R goes to $V_{DD}$ when the wordline WL0 is activated. In self-refresh mode as shown in FIG. 2B, SAP goes to $V_{PPZH}$ which is a predetermined voltage higher than $V_{PPZ}$ to boost the bitline voltage to $V_{DDH}$.

A necessary assumption here is that the DRAM core voltage $V_{DD}$ can be higher in self-refresh mode than in normal operating mode. For example, $V_{DD}$ is 2V in normal operating mode and 2.5V in self-refresh mode. If a PMOS transistor is used for the power source transistor, the period to enable the PMOS power source transistor can be longer to supply more current to the sense amplifier. Therefore, BLB_R goes to a higher voltage ($V_{DDH}$) than normal operation. SAN goes to $V_{SS}$ instead of $V_{BBZ}$ and the level of BL_R is clamped at $V_{TP}$ (i.e., $V_{SSH}$ voltage level) of the PMOS source transistor MPSRC1 instead of $V_{SS}$. Therefore, when WL0 is activated and the memory cell, C0, is read out. It should be noted that because BL_R is not $V_{SS}$ but is $V_{SSH}$ instead, then $V_{GS}$ of MNA1 is not zero, but is $-V_{SSH}$ and leakage current is suppressed significantly. When the sensing operation is finished and bitline pairs are equalized, the bitline precharge level is now not at $\frac{1}{2} V_{DD}$ but is at the higher voltage of $\frac{1}{2} *V_{DDH}$. Consequently, as $V_{GS}$ of NMOS transistor MNS1 is not reduced the device is not subject to any sensing speed degradation.

There are a number of ways according to the present invention to control the voltage levels at nodes LA and LAb. The methods below are provided by way of example and not limitation.

Controlling Voltage Levels at node LA.

When a PMOS transistor is used for the power source transistor, the period to turn on the PMOS transistor is preferably extended to supply a higher voltage to the sense amplifier by either controlling a pulse, in response to mode entry and/or exit signals, to enable the PMOS transistor or directly utilizing a mode entry and/or exit signal. By way of example and not limitation, two different source transistor types (pure PMOS and PMOS with a diode) can be utilized. In normal operation, the pure PMOS transistor and/or PMOS with a diode, can be turned on in normal operation while only the PMOS transistor with the diode can be turned on in self-refresh mode.

When an NMOS transistor is used for the power source transistor, the gate voltage can be controlled (e.g., a higher voltage than normal operation) to supply a higher voltage to the sense amplifier in the form of a pulse width or a mode entry and/or exit signal.

Figure 3D:
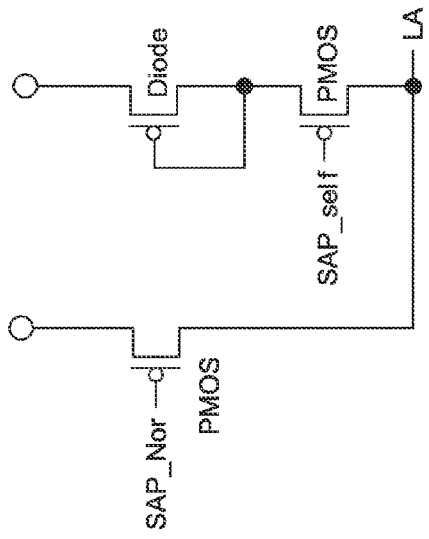
FIGS. 3A-3D are schematics of circuits for controlling power levels within the memory circuit according to the present invention.
Figure 3C:
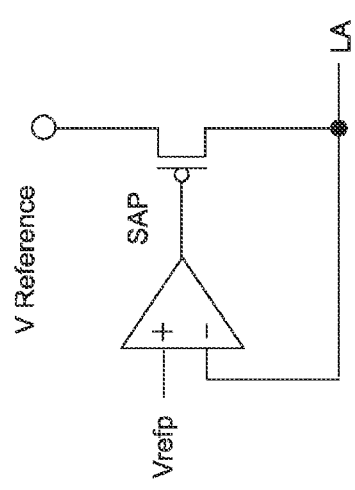
Figure 3B:
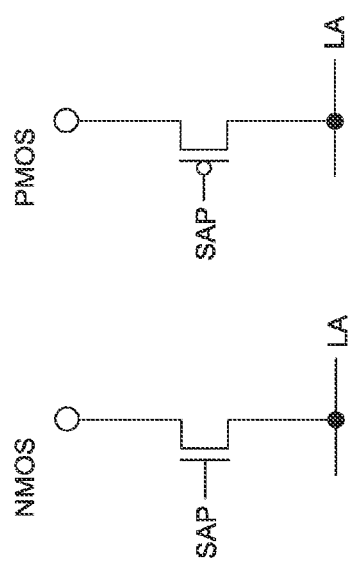
Figure 3A:
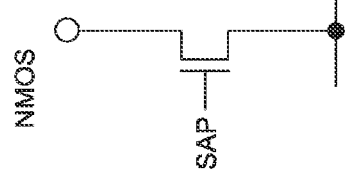

FIGS. 3A-3D illustrates examples of controlling the power levels of the memory circuit from an LAB signal in response to receiving a SAP, SAP_Nor or SAP_Self signal. In FIG. 3A an NMOS transistor is used and the gate signal can be controlled by a pulse or mode entry and/or exit signals or a combination of signals accordingly. In FIG. 3B a PMOS transistor is used and controlled accordingly. In FIG. 3C a PMOS transistor is used with an error detector, wherein the level of LA is set by a V Reference circuit from $V_{REFP}$. In FIG. 3D different types of PMOS source transistors are controlled accordingly by signals SAP_Nor and SAP_self.

Controlling Voltage Levels at Ground Level.

When a PMOS transistor is used for the ground source transistor, the gate voltage can be applied so as not to overcome the PMOS threshold voltage drop, e.g., $V_{SS}$ instead of $V_{BBZ}$. The gate can be controlled utilizing a form of pulse, or a mode entry and/or exit signal, or a combination of signals.

When an NMOS transistor is used for a ground source transistor, the period required to turn on the NMOS transistor can be controlled so as to be shorter, thereby preventing ground level discharging to $V_{SS}$. This period can be controlled in the form of a pulse, a mode entry and/or exit signal, or a signal combination. In a preferred embodiment, two different source transistor types (pure NMOS and NMOS with a diode) can be used. In normal operation, the pure NMOS transistor and/or NMOS transistor with a diode can be turned on in normal operation, while only the NMOS transistor with a diode can be turned on in self-refresh mode to clamp $V_{SS}$ at $V_{DIODE}$.

FIGS. 4A-4D illustrates examples of controlling the power levels of the memory circuit from an LAB signal in response to receiving a SAN, SAN_Nor or SAN_Self signal. In FIG. 4A a PMOS transistor is used and the gate signal can be controlled by a pulse, or a mode entry and/or exit signal, or the combination of signals accordingly. In FIG. 4B an NMOS transistor is used and controlled accordingly. In FIG. 4C an NMOS transistor is used with an error detector V reference circuit having output SAN, wherein the level of LAb is set by $V_{REFN}$. In FIG. 4D different types of NMOS source transistors are controlled accordingly by signals SAN_Nor and SAN_self.

A third method utilizes a combination of the two methods above, a negative wordline scheme and new bitline level control scheme. When this method is used, the circuit modifications to implement the method is not as complex or difficult as using only one of the two above mentioned methods. In this method, by not lowering a precharge wordline level as much as the first method, the design complexity can be reduced, and by not boosting the bitline level as much as the second method, the sensing speed is not significantly compromised and the power level does not need to be boosted as much. This lower level of voltage boosting is important, because as the operating voltage is reduced, there becomes no appreciable difference between the external voltage and the internal DRAM core operating voltage.

Figure 5A:
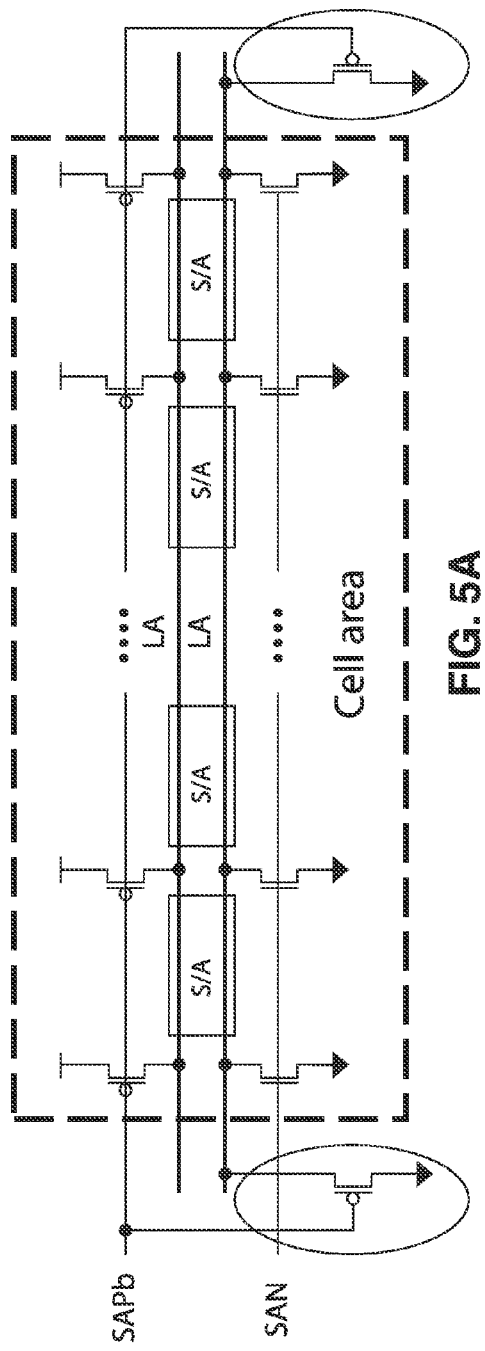
FIG. 5A is a schematic of a ground level control method according to an aspect of the present invention, showing a combination PMOS and NMOS SAN controller with a clamp (LVT-PMOS) between LAb and ground.
Figure 5B:
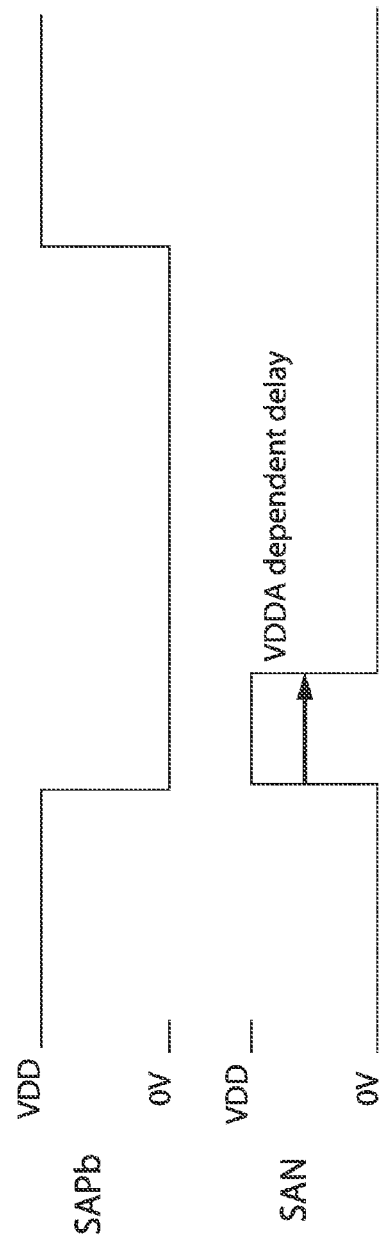
FIG. 5B is a timing diagram for the ground level control method as illustrated in FIG. 5A.

FIGS. 5A-5B illustrate a schematic and timing diagram for an example embodiment of a ground level control method according to one embodiment. In FIG. 5A a combination of NMOS and PMOS transistors are used to provide the ground level control of the LA lines between sense amplifiers (S/A). An LVT-PMOS clamp is shown on the SAN line, such as at each end, which is gated by the SAPb line. From FIG. 5A it can be seen that the gates of PMOS transistors are connected to the SAPb line, while NMOS transistors are connected to the SAN line. In FIG. 5B it can be seen that control signals SAN and SAPb are activated at the same time, with SAPb changing from $V_{DD}$ to 0V, and SAN changing from 0V to $V_{DD}$. However, in other implementations one signal may start before the other and high and low voltage can be other than $V_{DD}$ and 0V, respectively. Also note that in this example the control signal SAN uses pulse control, subject to a VDDA dependent delay as shown, but it should be appreciated that other types of control methods may be utilized. For example, a combination of pulse and other existing signals may be used. While both NMOS and PMOS transistors are used for ground level control, the PMOS transistor actually clamps the ground level in this example.

FIGS. 6A-6B illustrates an example schematic and timing diagram for an alternative ground level control method of the LA lines between sense amplifiers (S/A). This example is similar to that of FIGS. 5A-5B, but utilizes NMOS source transistors for the power source transistor, and provides an opposite polarity of the SAPb line. It should be noted that the LVT-PMOS clamp is shown on the SAN line, such as at each end, and gated by an inverted signal from the SAPb line. The SAN can use pulse control shown subject to VDDA dependent delay.

2. Methods to Reduce ICC3P Current.

One important parameter in DRAM operation is ICC3P mode, which is an operating mode referred to as "active power-down standby mode". In the ICC3P mode a memory bank is activated and CKE (clock enable signal) is low (disabled) and CSB is high (disabled) but address and control inputs are switching, while the data bus inputs are stable. In response to this mode of operation the sense amplifier shown in FIG. 1 is activated after reading the cell data and assuming that WL0 is enabled and the memory cell C0 is accessed with cell data low. Referring to FIG. 1, after reading the cell data, BL_R goes to low and BLB_R goes to high, wherein MNSRC1 and MPSRC1 are turned on. MPS2 and MNS1 are also turned on, but MPS1 and MNS2 are turned off.

It should be appreciated that power and ground source transistors may be different from FIG. 1, for example the power source transistor in FIG. 1 can be a PMOS transistor instead of an NMOS transistor. Although MPS1 and MNS2 are turned off because BL_R and BLB_R are $V_{SS}$ and $V_{DD}$, respectively, there is leakage current flowing through MPS1 and MNS2. The magnitude of the leakage current is on the order of a few micro amperes for advanced process technology, such as 90 nm technology and its magnitude will be larger as technology progresses toward 80 nm and 65 nm processes. Assuming a 90 nm technology with 8K (8*1024) sense amplifiers being activated with each sense amplifier having 5 µA leakage current, the total leakage current is very significant at about 40 mA.

Figure 7:
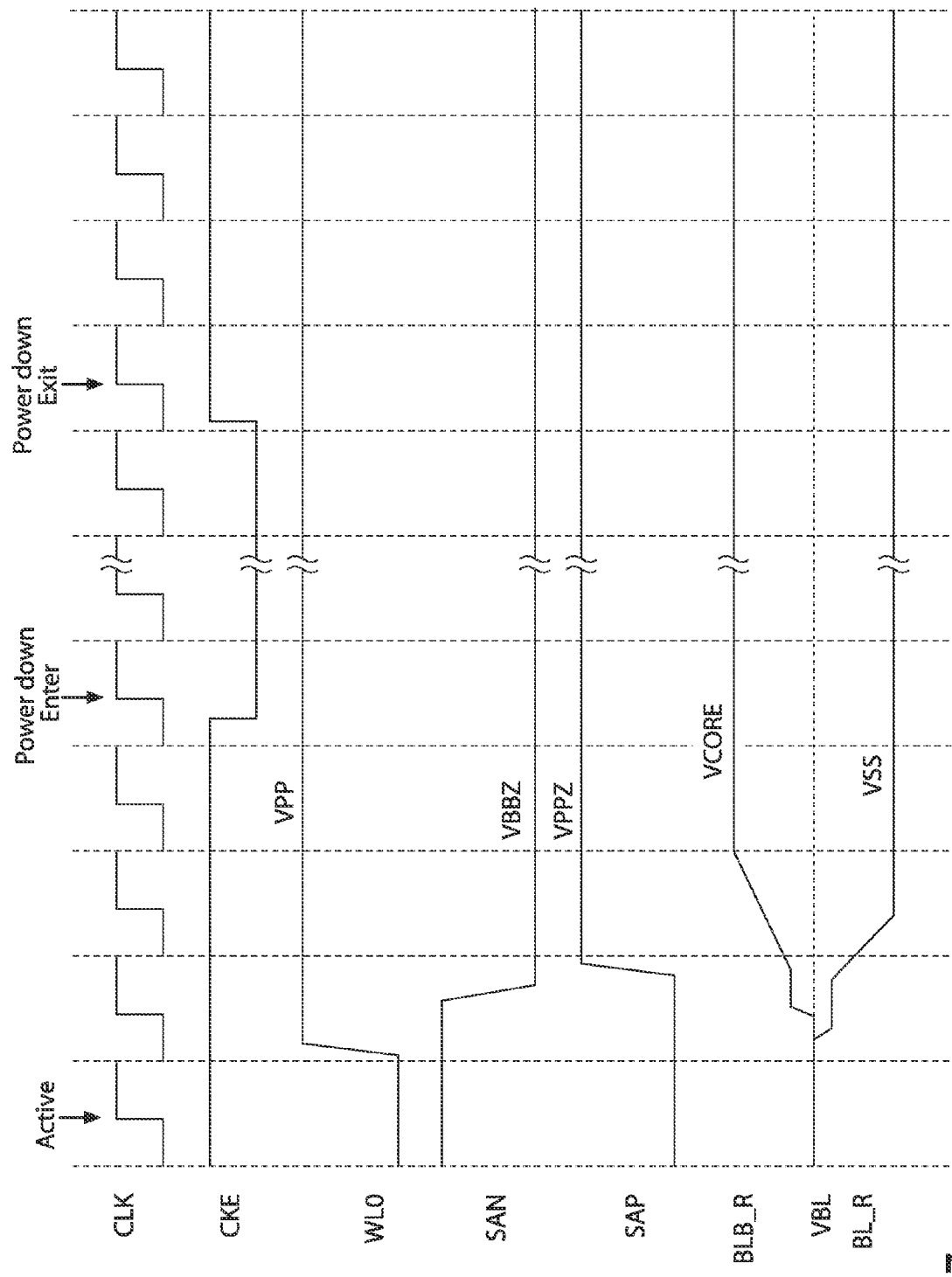
FIG. 7 is a timing diagram for a power source control as used for the circuit illustrated in FIG. 1.

FIG. 7 illustrates a timing diagram for a DRAM memory design based on the DRAM core configuration presented in FIG. 1. In active mode, WL0 is enabled to VPP and SAN and SAP goes to $V_{BBZ}$ and $V_{PPZ}$, respectively. Assuming that the data is low, from initial voltage VBL, signal BL_R goes to $V_{SS}$ and BLB_R goes to $V_{DD}$ ($V_{CORE}$: DRAM core operating voltage), respectively. DRAM clock CLK is shown with dashed lines representing each successive clock cycle. When the power down mode starts (marked as "Power down Enter"), CKE goes low but the memory bank is still activated, the sense amplifier is turned on and the leakage current flowing through the turned-off transistors can be unacceptably large. After CKE returns high power down mode is exited (marked as "Power down Exit") in the figure. In this invention, several methods to suppress the active power-down standby current such as ICC3P, is described which can also be applied to similar situations.

Figure 8:
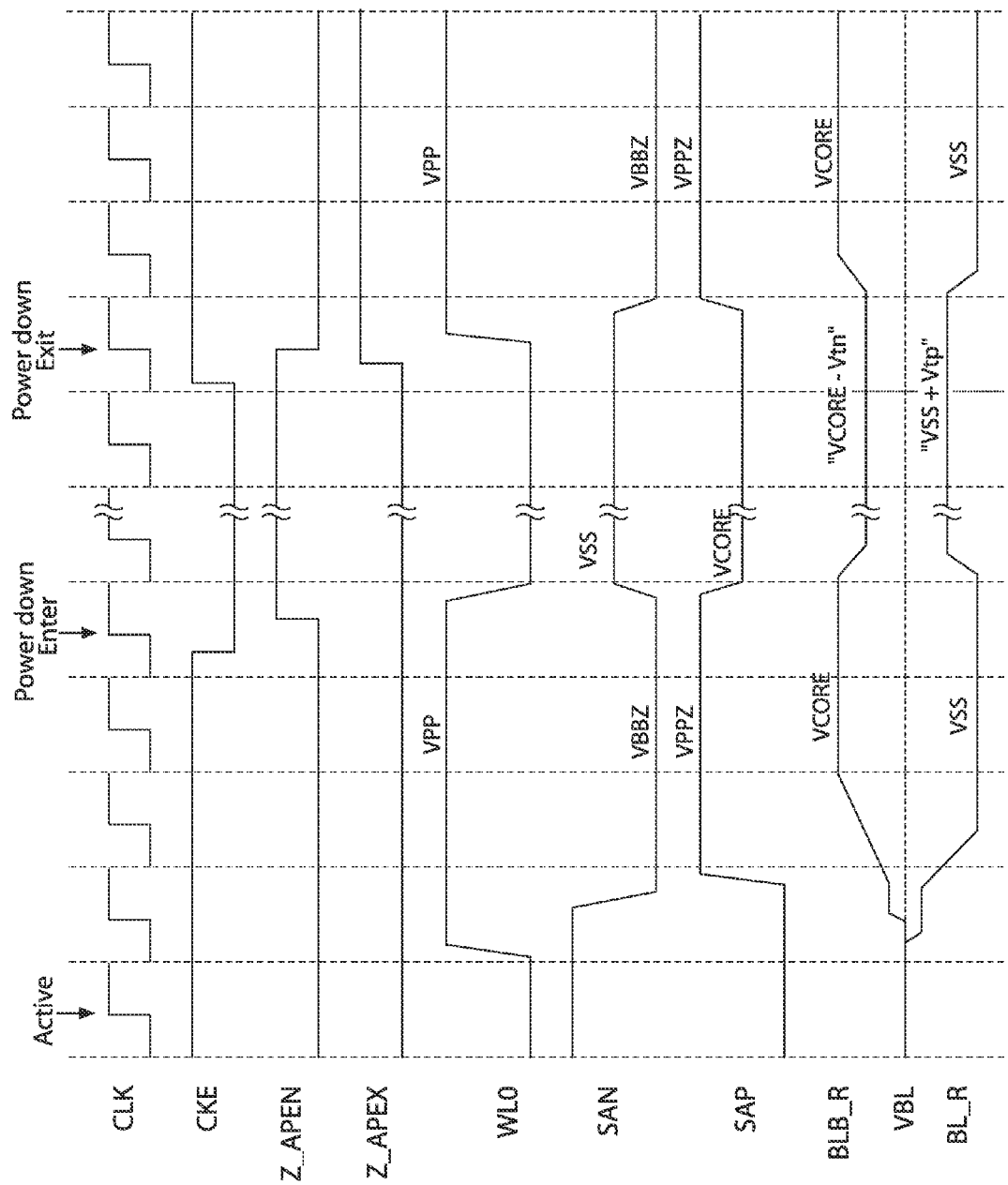
FIG. 8 is a timing diagram for a method of suppressing the active power-down standby current for DRAM core circuits.
Figure 9:
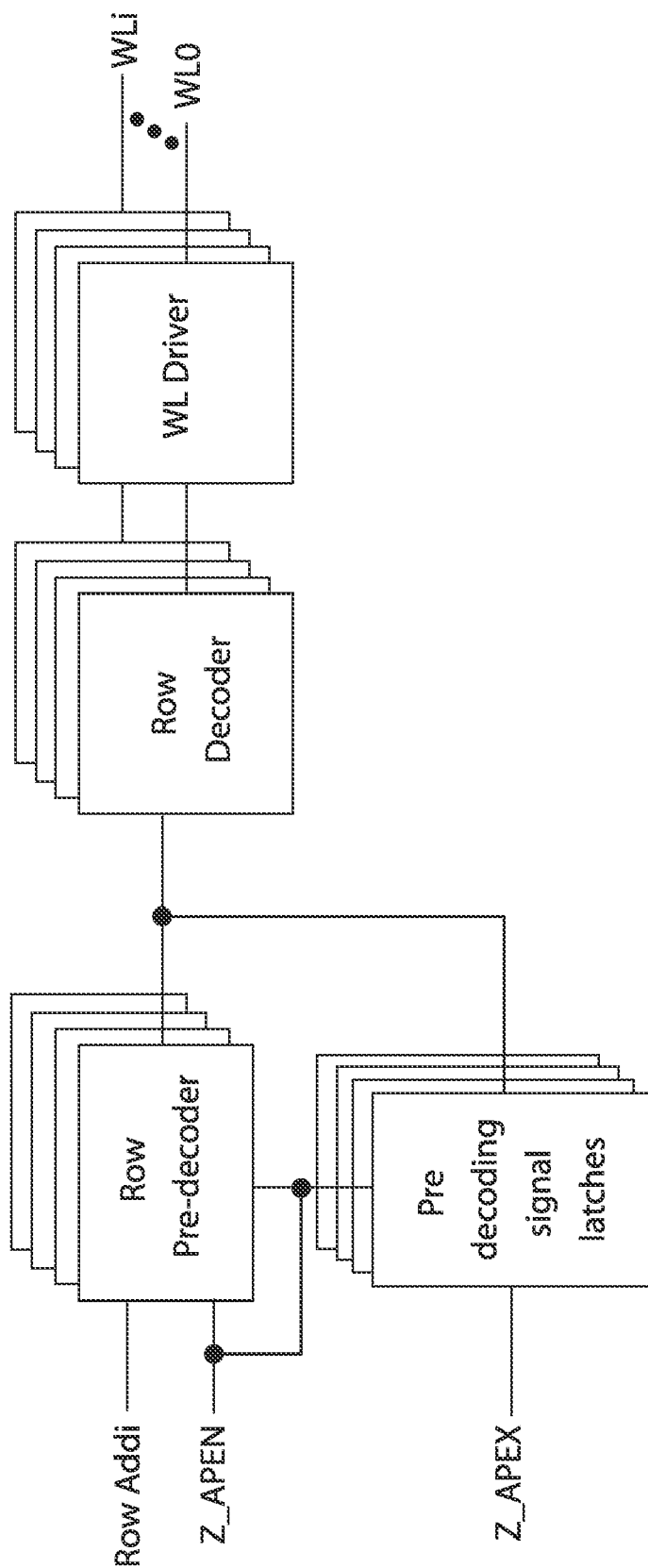
FIG. 9 is a block diagram of a memory device organization for suppressing active power down current according to an aspect of the present invention, and showing controlling power in duplicated circuits with pre-decoding signal latches.

FIG. 8 illustrates a method of suppressing the active power-down standby current for DRAM core circuits. The clock CLK is shown as in FIG. 7 with the "Active" portion shown, as well as the "Power down enter" and "Power down Exit" in response to the clock enable CKE. Active power down entry Z_APEN, as well as exit Z_APEX are also shown, which are also seen in FIG. 9. In this method the effective threshold voltage of sense amplifier transistors is increased by increasing the source-to-body voltage, $V_{SB}$. The word line WL0 is shown transitioning down from VPP during active power down. When the power down mode starts, the power source SAP transistor gate is biased from $V_{PPZ}$ to $V_{CORE}$ and the ground source SAN transistor gate is biased from $V_{BBZ}$ to $V_{SS}$, respectively. It will be seen that bits lines BL_R and BLB_R transition from VBL, and as a result of the different bias, the BLB_R level is lowered from $V_{CORE}$ to $V_{CORE}$-$V_{TN}$ (shown as VCORE-Vtn) due to the NMOS transistor voltage drop and the BL_R level is raised by PMOS threshold voltage $V_{TP}$ (shown as VSS+Vtp). Therefore, $V_{SB}$ of MPS1 and MNS2 can be increased by the amount of $V_{TN}$ and $V_{TP}$, respectively. Consequently, the leakage current flowing through the turned-off transistors, MPS1 and MNS2, can be effectively reduced. After the power down mode is finished, the levels for SAP and SAN return back to the normal values of $V_{PPZ}$ and $V_{BBZ}$, respectively.

FIG. 9 illustrates a block diagram of a memory device organization for suppressing active power down current. It should be appreciated that another major leakage current contribution within memory circuits arises from the use of duplicated circuits, such as row decoders (Row Decoder) and word line drivers (WL Driver), due to their large numbers. Accordingly, a second method to suppress the leakage current in ICC3P mode utilizes adding source transistors to these duplicated circuits whose state (on/off) can then be changed in response to device mode, such as by receiving mode entry and/or exit signals, shown by Z_APEN and Z_APEX respectively. The addition of source transistors is shown in FIG. 9 within the Row Pre-Decoder (Row Pre-Decoder) block receiving signals Row Addi and Z_APEN and the Pre-decoding signal latches (Pre-decoding signal latches) receiving the Z_APEX signal, Z_APEN and output from the Row Pre-decoder. Outputs from Row Pre-Decoder and Pre-Decoding signal latches are shown controlling a Row Decoder and word line driver (WL Driver), such as within a series of word lines WL0-WLi. Any desired combination of power and ground source transistors can be utilized for controlling power consumption of the repeated circuits.

By way of example, the combination of source transistors include: NMOS power source transistor and PMOS ground source transistor, NMOS power source transistor and NMOS ground source transistor, PMOS power source transistor and NMOS power source transistor, PMOS power source transistor and PMOS ground source transistor, NMOS and PMOS power/ground source transistors, NMOS and PMOS power source transistors and NMOS power source transistor, and so forth. According to this aspect of the invention, when the chip operates in ICC3P mode, source transistors connected to such repeated circuits as row decoders (Row Decoder) and word line drivers (WL Driver) are turned off to suppress leakage current.

According to one aspect of the invention, instead of maintaining the state of the wordlines, the wordline (state) information is stored in a circuit as the wordlines are turned off and retrieved as the wordlines are turned back on again. According to one implementation, the wordline information is stored at the output of pre-decoders (Row Pre-Decoder) in the pre-decoding signal latches (Pre-Decoding Signal Latches) as shown in FIG. 9. When the chip exits ICC3P mode, the wordlines are re-activated using information stored at the output of pre-decoders and the cell data is refreshed by the sense amplifier. It should be appreciated that upon leaving the power down mode, there is a short but sufficient time (i.e., a few tens of nano-seconds) to reactivate the wordline and refresh the cell data. In the repeated circuits, extra high $V_T$ transistors can be utilized instead of adding and controlling source transistors.

Figure 10:
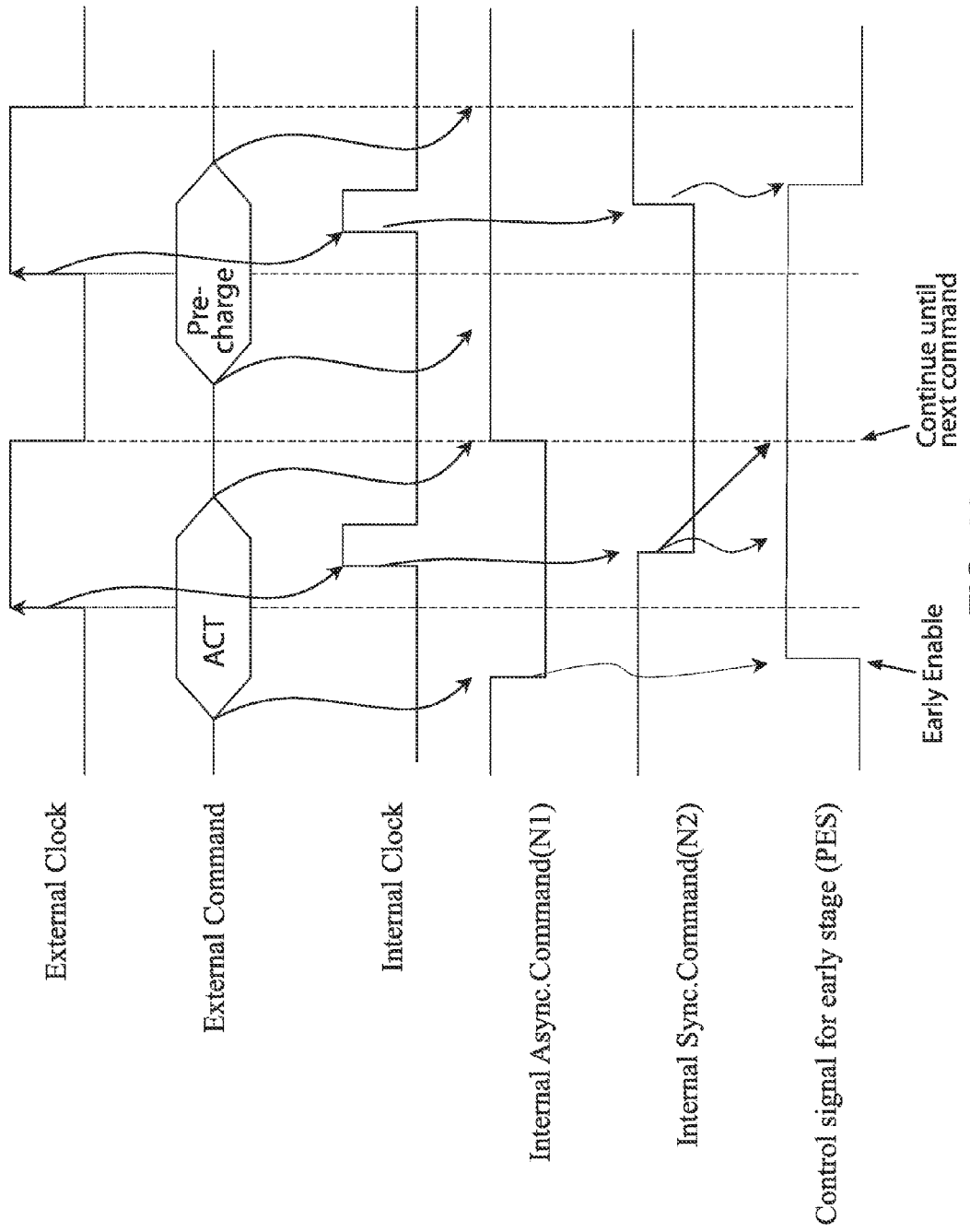
FIG. 10 is a timing diagram for a method of suppressing active power down current utilizing a combination of controlling bitline sense amplifiers and source transistors within repeated circuits according to an aspect of the present invention.

FIG. 10 illustrates a timing diagram in reference to the External Clock, External Command, Internal Clock, Internal Asynch. Command (N1), Internal Synch. Command (N2), and Control signal for Early Stage (PES) for a third method of suppressing active power down current utilizing a combination of controlling bitline sense amplifiers and source transistors within repeated circuits. The timing diagram also shows ACT and Pre-charge intervals, an early enable (Early Enable) being performed and the control signal continuing until next command (Continue until next command). When ICC3P mode is entered the source transistors connected to the row decoders and wordline drivers are turned off, and the wordline information is stored at the output of row pre-decoders or row decoders, as described with regard to FIG. 9. The levels of sensing nodes (LA and LAb in FIG. 1) are lowered and boosted, respectively, to increase the effective threshold voltages of sense amplifier transistors. When ICC3P mode is terminating, the wordline is reactivated and the levels of sensing nodes return to normal ($V_{CORE}$ and $V_{SS}$, respectively) wherein the cell data is refreshed.

It should be appreciated that the voltage levels of the sensing nodes can be lowered through the use of any desired transistor types for each sensing node, for example: NMOS for power source and PMOS for ground source, PMOS for power source and NMOS for ground source, or NMOS for power source and NMOS for ground source, and so forth. It should be noted that in the example of FIG. 9, both NMOS and PMOS source transistors are used for power and ground source transistors, respectively. When ICC3P mode starts, the gate signal of the NMOS power source transistor, SAP, goes down to $V_{CORE}$ from $V_{PPZ}$ and the gate signal of PMOS ground source transistor, SAN, goes up to $V_{SS}$ from $V_{BBZ}$. It should also be noted that the level of sensing nodes LA and LAb can be controlled by using different methods as described in relation to FIGS. 3A-3D and FIGS. 4A-4D.

When the ICC3P mode starts, higher $V_T$ transistors in row decoders and wordline drivers are turned on while higher performance transistors (normal or low $V_T$ transistors) are turned off. The levels of sensing nodes (LA and LAb in FIG. 1) are lowered and boosted respectively to increase effective threshold voltages of sense amplifier transistors. When the ICC3P mode is finished, the voltage levels of sensing nodes return to normal ($V_{CORE}$ and $V_{SS}$, respectively) and the cell data is refreshed.

When the ICC3P mode is entered, the source transistors are connected to row decoders and the wordline drivers are turned off and the wordline information is stored at the output of row pre-decoders or row decoders. The power and ground source transistors of bitline sense amplifiers are turned off. When the ICC3P mode is finished, the wordline is reactivated and the power and ground source transistors of bitline sense amplifiers are turned on to restore the levels of sensing nodes to normal levels ($V_{CORE}$ and $V_{SS}$, respectively) and the cell data is refreshed.

3. Methods for Early Wake-Up.

Source transistors are added to a circuit block implemented with low $V_T$ transistors to improve speed and reduce leakage current by shutting off source transistors. Some example combinations of power/ground source transistors according to the present invention can include NMOS/PMOS, NMOS/NMOS, PMOS/PMOS, PMOS/NMOS, NMOS & PMOS/PMOS & NMOS. The gate voltages of the source transistors can be varied from $V_{PPZ}$ to $V_{BBZ}$ according to the specific applications. Therefore, in source transistor circuit configurations according to the invention, the control of source transistors is critical wherein it is often appropriate to utilize different control methods depending on circuit application.

A first method of controlling the source transistors is to turn them on at the rising or falling clock edge of command information. For example, when the clock falling edge is used to accept a command, source transistors can be turned on after determining if the command is valid. However, in this case, since the virtual power and ground levels such as potentials at $V_{DDZ}$ and $V_{SSZ}$ in FIG. 8 take time to return to $V_{DD}$ and $V_{SS}$ levels, there may be some operating delay and the chip may not be ready, thus leading to a possible device malfunction.

Referring again to FIG. 10 a method is described for a wakeup means. Typically, a command (shown as External Command) is provided to the memory device before the clock edge (shown as External Clock), a rising edge in the figure, and bracketed with a set-up time. The external command is shown for row activation (shown as ACT), and for pre-charging (shown as Pre-charge). An internal asynchronous signal N1 (shown as Internal Async. Command (N1)) is generated after receipt of an external command, such as an active command. The availability of signal PES (shown as Control signal for early stage (PES)) allows source transistors to be turned on earlier than the clock (denoted by Early Enable) and to continue (denoted by Continue until next command).

At the rising edge of the clock (shown as External Clock), an internal clock (shown as Internal Clock) and an internal synchronous signal N2 (shown as Internal Sync. Command (N2)) are generated. When the internal clock is generated, the state of the internal asynchronous command is valid (low for this figure), and the control signal PES maintains the valid state. If a command is received by the chip, such as a precharge command, the internal asynchronous signal N1 is not generated (high in the second clock of this figure), because this command does not activate the chip. At the rising edge of the clock, the internal clock is generated, yet because the state of N1 is not valid, internal synchronous signal N2 is disabled (it goes to high). The control signal PES is also disabled (low for this figure) and source transistors are turned off. It should be appreciated that the described circuit provides a means to enable source transistors earlier than the arrival of the clock signal and to control them based on command state.

In some applications, the chip allows command switching but is in an idle or don't-care condition. In this case, even though there is no specific chip operation, the source transistors repeatedly turn on and off, wherein power is consumed unnecessarily due to repeated capacitive charging and discharging. To reduce power consumption due to unnecessary switching, an aspect of the invention teaches another method for controlling power source transistors.

Figure 11:
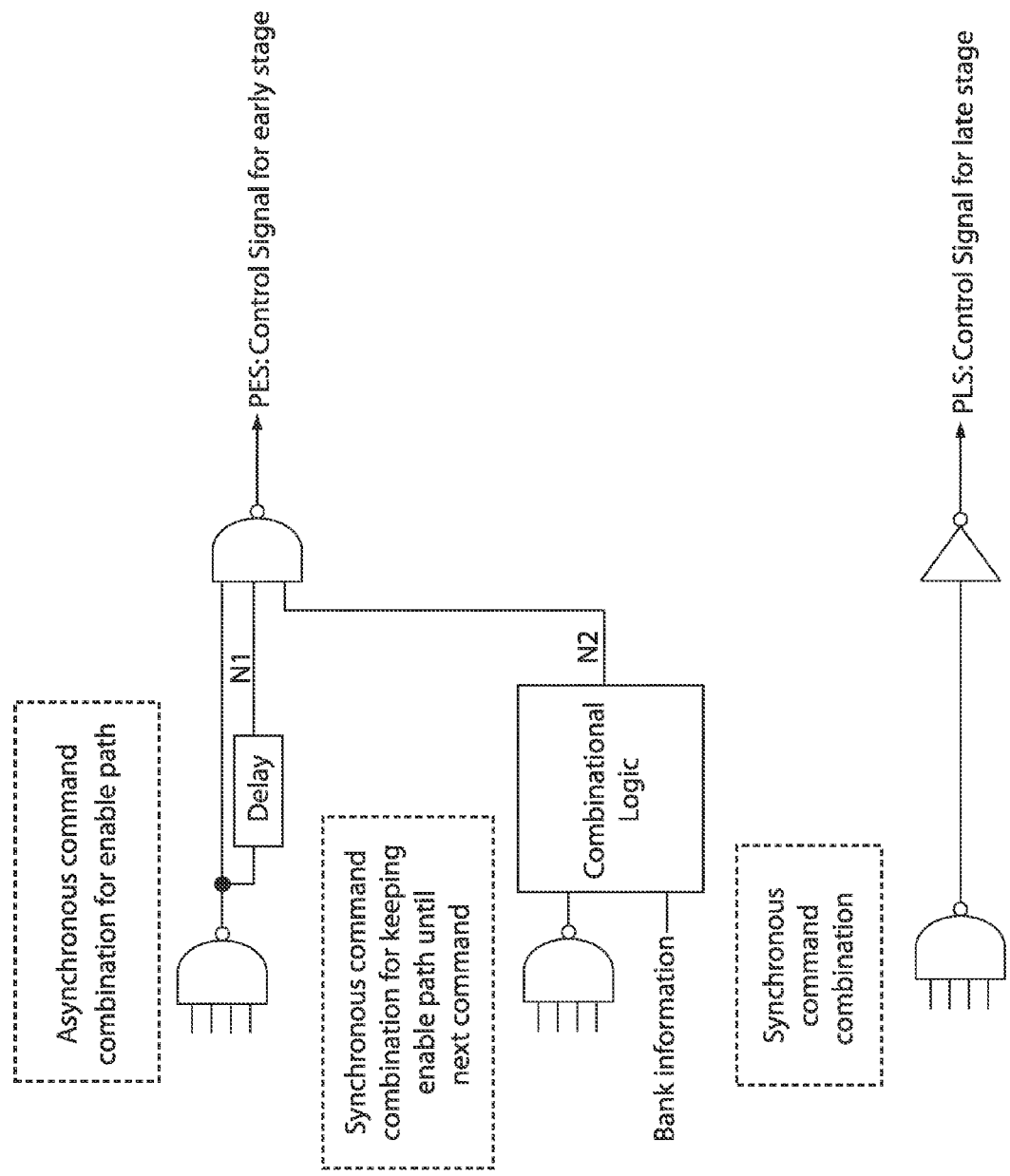
FIG. 11 is a schematic of early and late stage control signal generation according to aspects of the present invention.

FIG. 11 illustrates an example embodiment of generating source control signals, although a number of alternative mechanisms can be implemented by one of ordinary skill in the art based on the teachings herein. The figure shows a first circuit having an asynchronous command combination for enable path (Asynchronous command combination for enable path) associated with a logic circuit including a delay (Delay) with signal N1 shown being combined with signal N2 from a combinational logic circuit (Combinational Logic) for which one input is bank information (Bank Information) to provide synchronous command combination for keeping enable path until next command (synchronous command combination for keeping enable path until next command). In the lower portion of the figure is shown a synchronous command combination (Synchronous command combination) which outputs a control signal (PLSControl Signal for late stage). In this figure the circuit block diagrams illustrate methods of generating two (or multiple) source control signals. A control signal for early stage, PES, (shown as PES Control Signal for early stage) is generated based on the idea presented in FIG. 10 in order to control early circuit stages. Denoted in the figure, the top circuits show asynchronous command combination for enable path, while the middle circuits represent synchronous command combination for keeping the enable path until the next command. The signal PES is generated to enable source power transistors before the clock rising edge, such as shown by gating a command signal with a delayed command signal (shown as block marked Delay) and a signal N2. Another control signal for late stage (shown as PLS Control Signal for late stage), is generated with a combination of clock and command in order to control late circuit stages denoted as a synchronous command combination.

Figure 12:
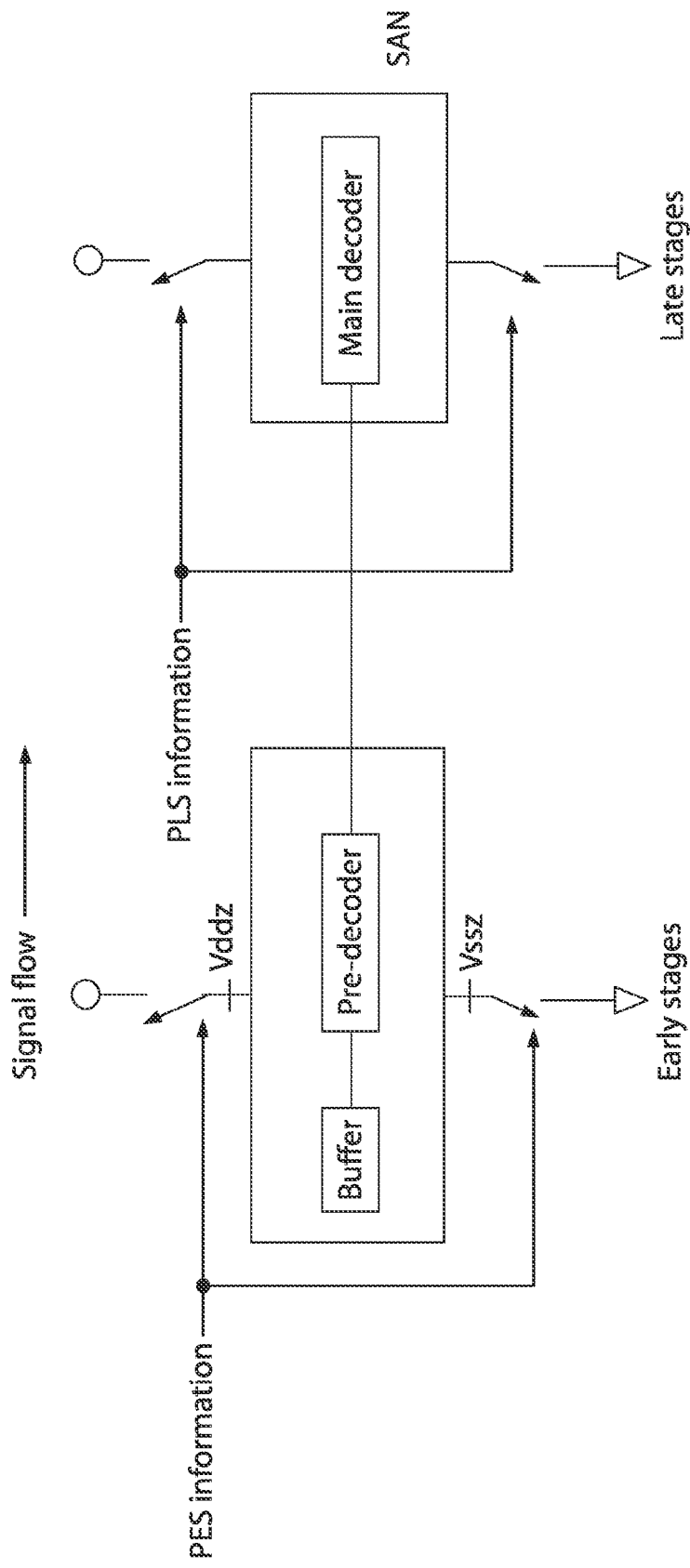
FIG. 12 is a block diagram of using PES (early stage) and PLS (late stage) control signals for circuit control according to the present invention.

FIG. 12 illustrates gating control signals to circuit blocks in early and late stages according to an aspect of the present invention. The signal flow (signal flow) is shown from left to right with PES information (PES Information) shown controlling switches for Vddz and Vssz, of a early stage block (Early stages) containing a buffer (Buffer) and a pre-decoder (Pre-Decoder), and an output to a main decoder (Main decoder) of a later stage (Late stages) within another circuit block in the figure. These control signals are gated to circuit or circuit blocks depending on timing to enable each circuit. For circuits used in early stages of operation (shown illustrated by Buffer connected to a Pre-Decoder), an early wake-up signal with asynchronous and synchronous information, PES information, is gated to control source transistors (shown controlling the supply of Vddz and Vssz) connected to those blocks to activate the source transistors earlier than the clock. For circuits at a later stage of operation, a control signal with synchronous information, PLS information, is gated to prevent unnecessary switching power consumption. Note that control signals can have different polarities accordingly for properly controlling different types of source transistors. Address buffer drivers and command generators are controlled by the early wake-up signal PES, and other circuits are controlled with the late wake-up signal PLS, with a Main decoder shown by example providing source control signal SAN.

Figure 13:
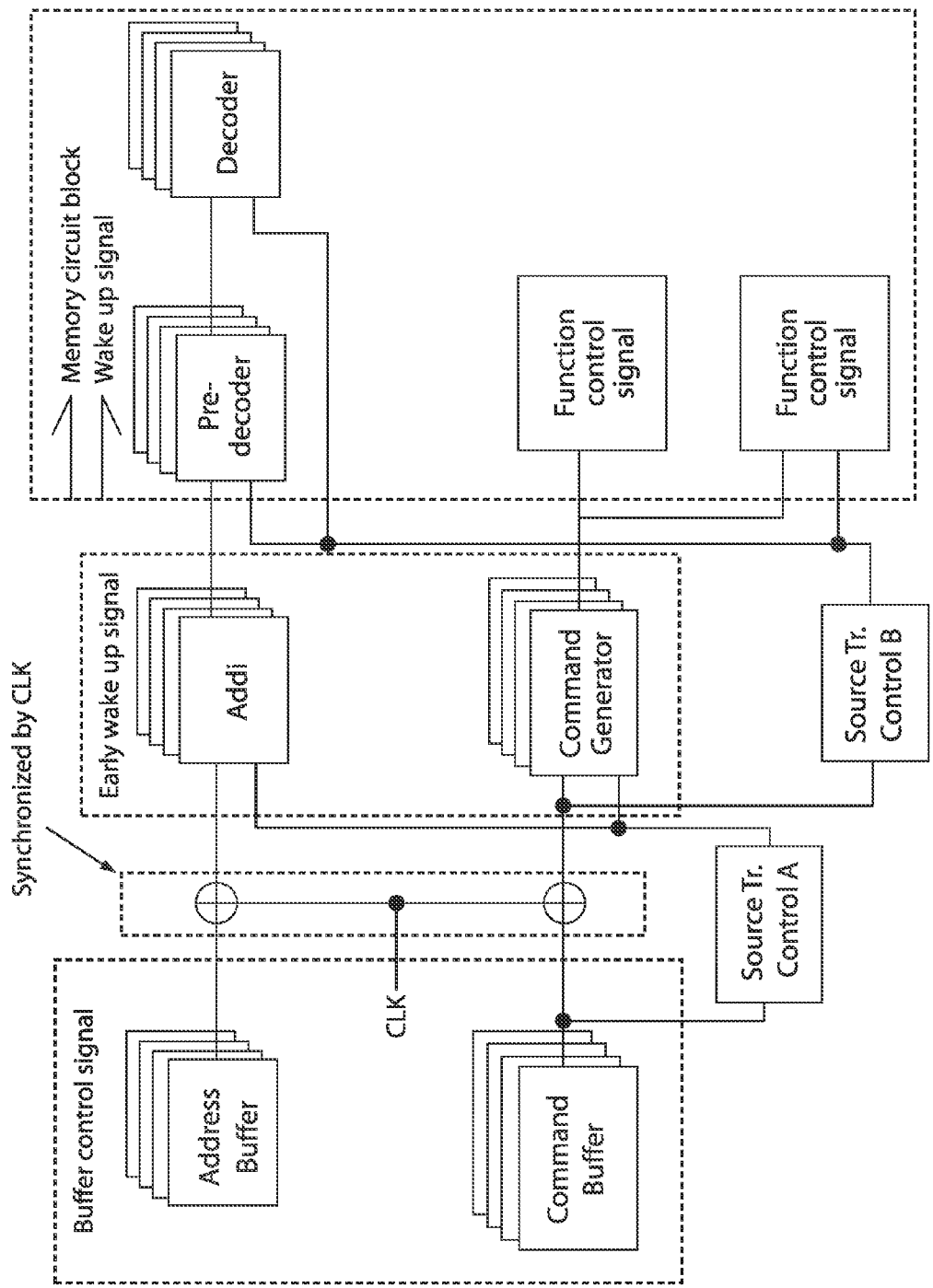
FIG. 13 is a block diagram of control generation based on buffer control signals according to an aspect of the present invention.

FIG. 13 illustrates another application example of a control generator circuit according to the present invention. In the figure is shown major blocks, surrounded by dashed lines, comprising buffer control signal (Buffer control signal) containing an address buffer (Address Buffer) and command buffer (Command Buffer), clock synchronizer receiving CLK (CLK) (Synchronized by CLK), an early wake up signal (Early wake up signal) receiving CLK synchronized output and a source control signal (Source Tr. Control A), and a memory circuit block wake up signal (Memory Circuit Block Wake up signal) receiving a source control signal (Source Tr. Control B) and containing a pre-decoder (Pre-decoder), a decoder (Decoder), a showing two instances of function control signal (Function control signal). The figure shows a buffer control signal block (dashed lines) having an address buffer and command buffer, synchronized by CLK, from which an early wake-up signal block (dashed lines), depicted with Addi and Command Generator blocks, generates signals to a memory circuit block (dashed lines) having a pre-decoder, decoder, and function control signal circuits. It should be appreciated that source transistor control circuit (shown as Source Tr. Control A and Source Tr. Control B) are not synchronized by CLK. In addition, source transistor control circuit A and source transistor control circuit B are shown for reducing leakage currents.

There are a number of important aspects which have been discussed so far, the following provided by way of partial summary. Generating a wake-up signal to enable source transistors based on a signal received earlier than the clock signal. The state of the wake-up signal can be determined by a command at the clock edge. Different wake-up signals can be generated to control different circuit blocks depending on signal timing flow. An early wake-up signal can be generated to enable source transistors to activate the source transistors earlier than the clock using asynchronous information of command and synchronous commands referenced to the clock. A late wake-up signal can be generated with command and clock information to prevent unnecessary switching power consumption due to unnecessary turning on and off of source transistors. The early wake-up signal is applied to the circuits at early timing stages and the late wake-up signal is applied to the circuits at a late timing stage. Each control signal can have proper levels and polarities for different source transistor types 4. Methods to Control Source Transistors.

Figure 14A:
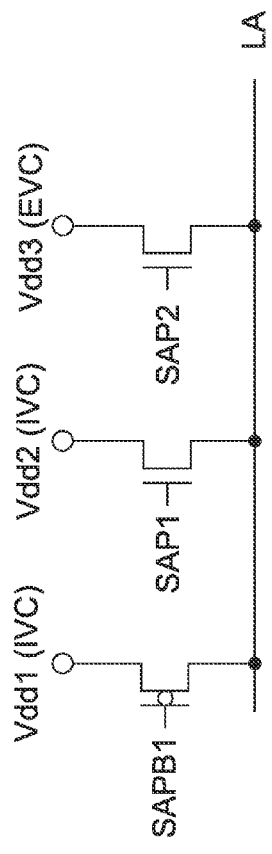
FIG. 14A is a schematic of power source transistor control according to an aspect of the present invention.
Figure 14B:
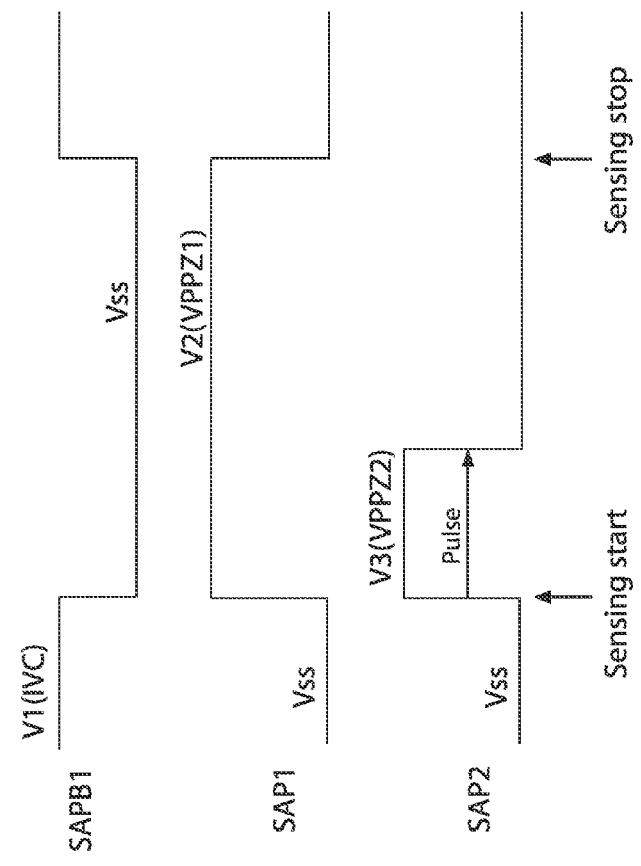
FIG. 14B is a timing diagram for the power source transistor control of FIG. 14A.

FIGS. 14A-14B illustrates an example embodiment of power source control, showing a schematic and timing diagram, respectively. When using power source transistors it will be appreciated that the virtual power line associated with the source transistors needs to be charged sufficiently early and be ready to supply the necessary supply current so that the circuit functions as intended. One way of accomplishing this according to the present invention is to take advantage of the fact that the externally supplied voltage (EVC) is always higher than the internally generated supply voltage (IVC). Internal supply voltages (IVC) are exemplified as voltages Vdd1 (IVC) and Vdd2 (IVC), while external supply voltages (EVC) are exemplified as voltage Vdd3 (EVC). Referring to the figure, the memory core configuration shown in FIG. 1 is used, with the source transistors connected to node LA to supply the sense amplifier. In this example, the NMOS transistors are preferably located in the conjunction area and the PMOS transistors are preferably located elsewhere. Alternative locations can be utilized, for example in response to the application as needed.

In the case shown, EVC is the external supply voltage and IVC is internally generated voltage. As seen in FIG. 14B, the control signal SAP2 turns on for a certain period to a third voltage level (V3) VPPZ2 level which is sufficiently high to turn on the NMOS transistor connected to Vdd3. This transistor helps to quickly charge the virtual power line because it is connected to EVC, meaning that a large amount of current can flow. The NMOS transistor controlled by signal SAP1 also charges the virtual power line from internal supply Vdd2 at the same time and establishes the final voltage of the virtual power line due to the stable nature of IVC. In FIG. 14B the output of SAP2 is shown changing from $V_{SS}$ to a second voltage (V2) VPPZ1. SAPB1 is shown controlling a PMOS transistor coupled to internal voltage source Vdd1. In FIG. 14B, SAPB1 is shown changing from a first voltage level (V1) to $V_{SS}$. An important function of the PMOS transistor driven by SAPB1, besides charging the virtual power line, is to make sure that the final virtual power line voltage is as intended in case VPPZ1 fails to reach a sufficiently high voltage due to circuit malfunction, environmental effects, process variation, and so forth. The PMOS transistor only requires a $V_{SS}$ voltage level to allow it to fully turn on so it will make sure that the virtual power line voltage is established at the proper level. FIG. 14B depicts the simultaneous transition of SAP1 and SAP2 denoted in the figure as sensing start. SAP2 is shown as a pulse, while SAP1 is extended to the point marked as sensing stop in the figure. This example shows control signals SAPB1, SAP1, and SAP2 turning on at the same time but they may turn on in any combination in other applications.

5. Layout Guidelines.

The following section describes unit layout, block layout and core layout according to an aspect of the present invention which is referred to as z-logic.

The layout method provides for placing at least one power/ground source transistor inside a layout block composed of logic transistors. For example, at least one power/ground source transistor is placed closer to power/ground line than the logic transistors. It should be appreciated that this may be implemented with: (1) the power source transistor including at least one NMOS transistor, (2) the ground source transistor including a PMOS transistor, (3) the power source transistor including at least one NMOS transistor and the ground source transistor including at least one PMOS transistor, (4) the power source transistor including NMOS and PMOS transistors, or (5) the ground source transistor including a PMOS transistor and an NMOS transistor.

The method also describes placing at least one power/ground source transistor outside the layout block composed of logic transistors. In one embodiment the source transistor is placed under the power lines that do not cross the layout block composed of logic transistors. The source transistors can be comprised as (1) through (5) listed above. In addition, the source transistors can be lumped for the entire logic block or any desired portion thereof. In one embodiment the source transistors can be placed in a distributed manner wherein the power and source transistors are located adjacent to each layout block. In one implementation a power source transistor and a ground source transistor drive the entire layout block. In one implementation the layout block is segmented and a power source transistor and a ground source transistor is placed per each segment.

Described according to an aspect of the invention is the placement of a virtual power line, which is a power line that connects source transistors to logic transistors, closer to the logic transistor than to the power line.

In one implementation source transistors are placed in the gap between column decoders created by sub-wordline drivers or strapping. Alternatively, the source transistors can be placed in the gap between row decoders created by the bitline sense amplifier. As another alternative, the source transistors that pertain to bitline sense amplifiers can be placed in the gap between sub-wordline drivers created by bitline sense amplifiers.

In one embodiment of bitline sense amplifier for a DRAM, a PMOS ground source transistor for an NMOS latch is placed in the NWELL of a PMOS latch. Similarly, an NMOS power source transistor for a PMOS latch can be placed in a PWELL, or P-type substrate, of an NMOS latch.

In one embodiment of DRAM, source transistors are placed on each bitline pair or group of bitline pairs.

Figure 15:
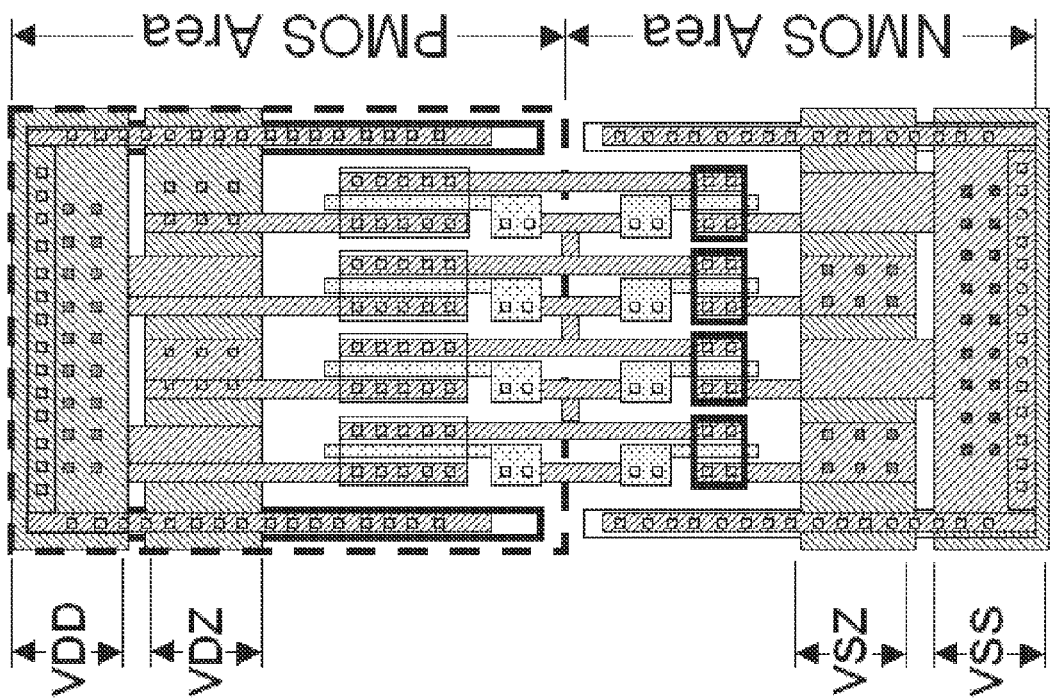
FIG. 15 is a layout for a circuit unit (Type 1) showing source transistor locations on a memory block which supports virtual power lines according to an embodiment of the present invention.

FIG. 15 illustrates a unit layout referred to as Type 1. Virtual power lines $V_{DZ}$ and $V_{SZ}$ are shown with power lines $V_{DD}$ and $V_{SS}$. The source transistors are located separately. It can also be seen in the figure that the PMOS area (encircled by dashed line on top) is separated from the NMOS area beneath it. Semiconductor layers are shown, such as depicted by M1C, M2C and M3C. In addition, three metal layers are shown, for example Metal 1 is for interconnection, Metal 2 is for local power and global interconnection, and Metal 3 is for global bussing and main power.

Figure 16B:
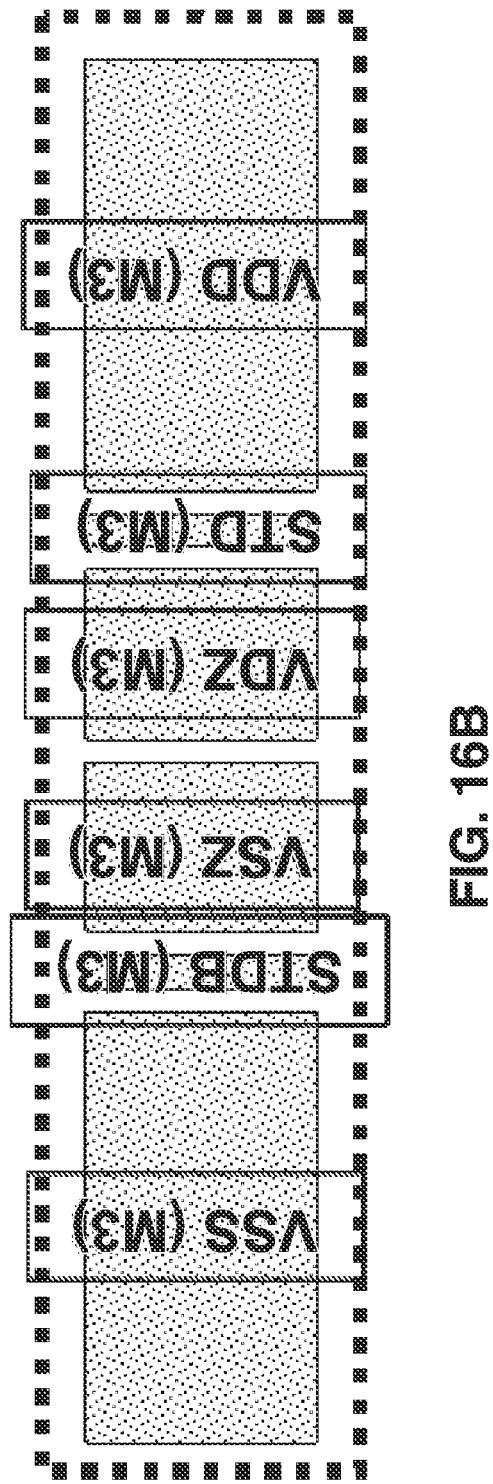

FIGS. 16A-16B illustrate a block layout containing a number of the units shown in FIG. 15 through the center of the layout, with groups of source transistors, denoted on both sides of the layout in a virtual power driver area, separate from the unit area with source transistors. The transistors are placed beneath the power lines to eliminate layout penalty (loss of usable area). Virtual power drivers are shown on each block with bussing shown in an exploded view 16B as it extends from the top of the layout. Bussing marked in FIG. 16A, is shown in detail in FIG. 16B including VDD, VSS, VDZ, VSZ, STD and STDB.

Figure 17:
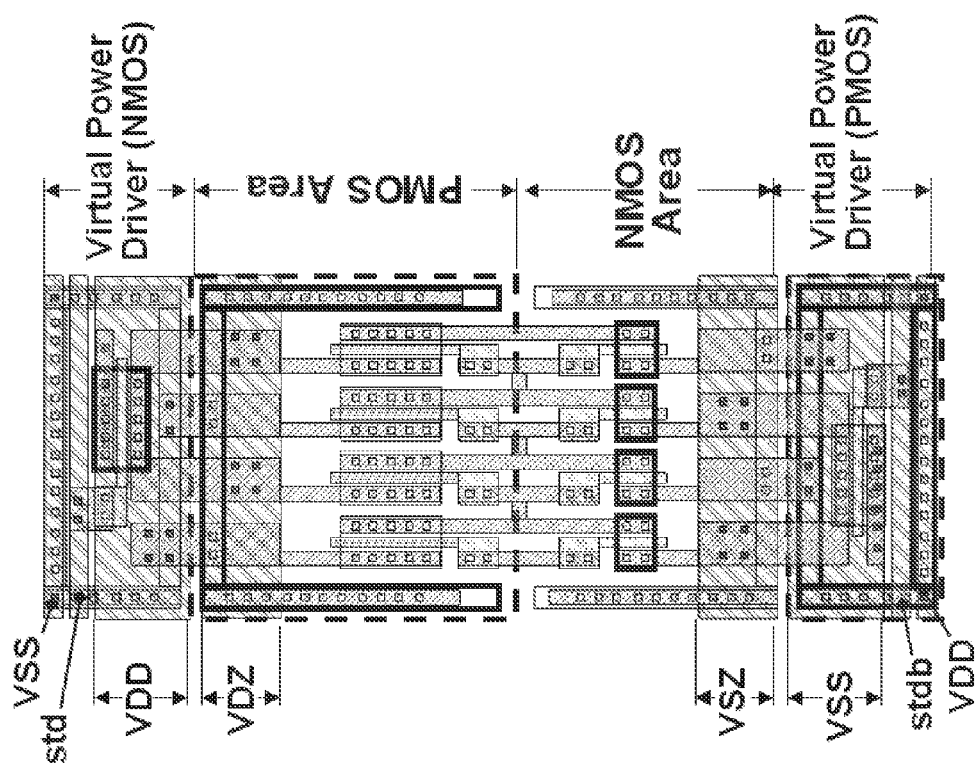
FIG. 17 is a layout for a circuit unit (Type 2) showing source transistor locations on a memory block which supports virtual power drivers according to an embodiment of the present invention.

FIG. 17 illustrates another unit layout, herein referred to as Type 2, wherein the source transistors are placed vertically above and under logic transistors, and/or are horizontally placed next to logic transistors. The source transistors can be seen in the top and bottom areas of the layout with the bussing. NMOS virtual power drivers are shown in the upper source transistor area and PMOS virtual power drivers are shown in the lower source transistor area. The bussing shown comprises $V_{SS}$, std, $V_{DD}$, $V_{DZ}$, $V_{SZ}$, $V_{SS}$, stdb, and $V_{DD}$. A PMOS area is shown in the upper half of the layout with an NMOS area located in the lower portion.

Figure 18:
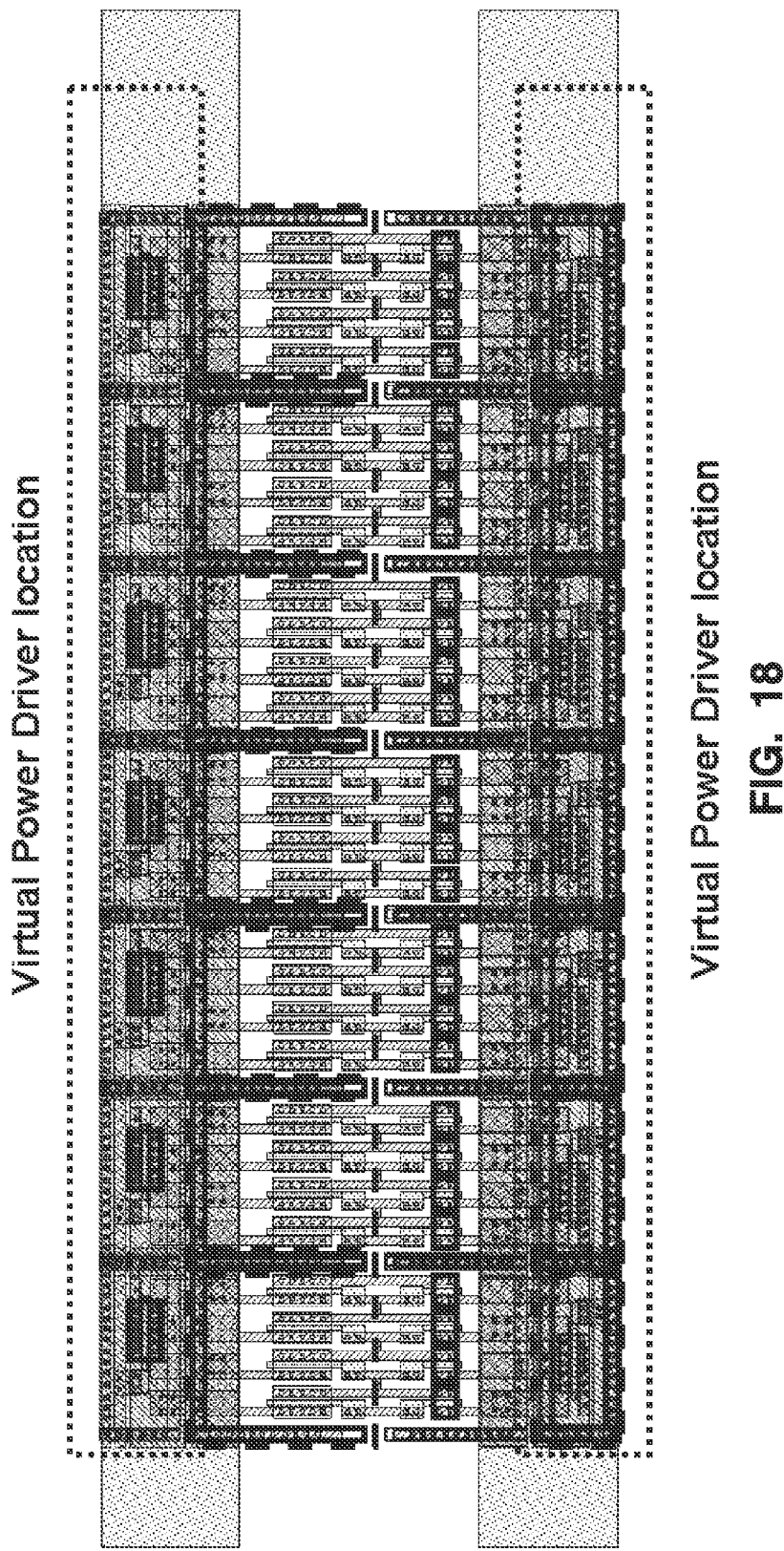
FIG. 18 is a layout for a circuit block comprising a plurality of the unit blocks shown in FIG. 17.

FIG. 18 is a Type 2 block layout containing a number of the unit layouts of FIG. 17. The virtual power driver locations are shown in dashed lines on the upper and lower portions of the block within this figure. This type of block layout is particular well-suited for use for so-called 'fuse-box circuits'.

FIGS. 19A-19B illustrate a z-logic column decoder layout according to an aspect of the present invention, in which source transistors are placed in column decoder holes. Cell arrays are shown being crossed by a subword line driver, bit line sense amplifier (S/A), column drivers and so forth. A virtual power driver location is shown at the intersection of the sub word line driver and column decoder areas within a column decoder hole. FIG. 19B depicts an exploded view of the bus lines in the decoder area wherein $V_{SS}$, stdb, $V_{SZ}$, $V_{DZ}$, std and $V_{DD}$ are seen.

Figure 20B:
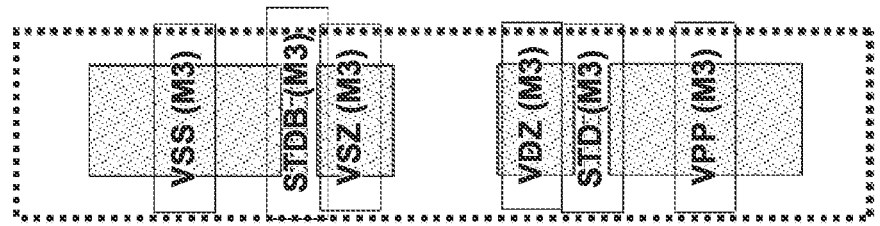
FIGS. 20A-20B is a layout for a z-logic row decoder according to an aspect of the present invention, showing virtual power drivers located in row decoder holes and source transistors of the bitline sense amplifier located in relation to bitline pairs (singly or in various combination), or in an area crossed by sense amp area and sub-wordline driver.
Figure 20A:
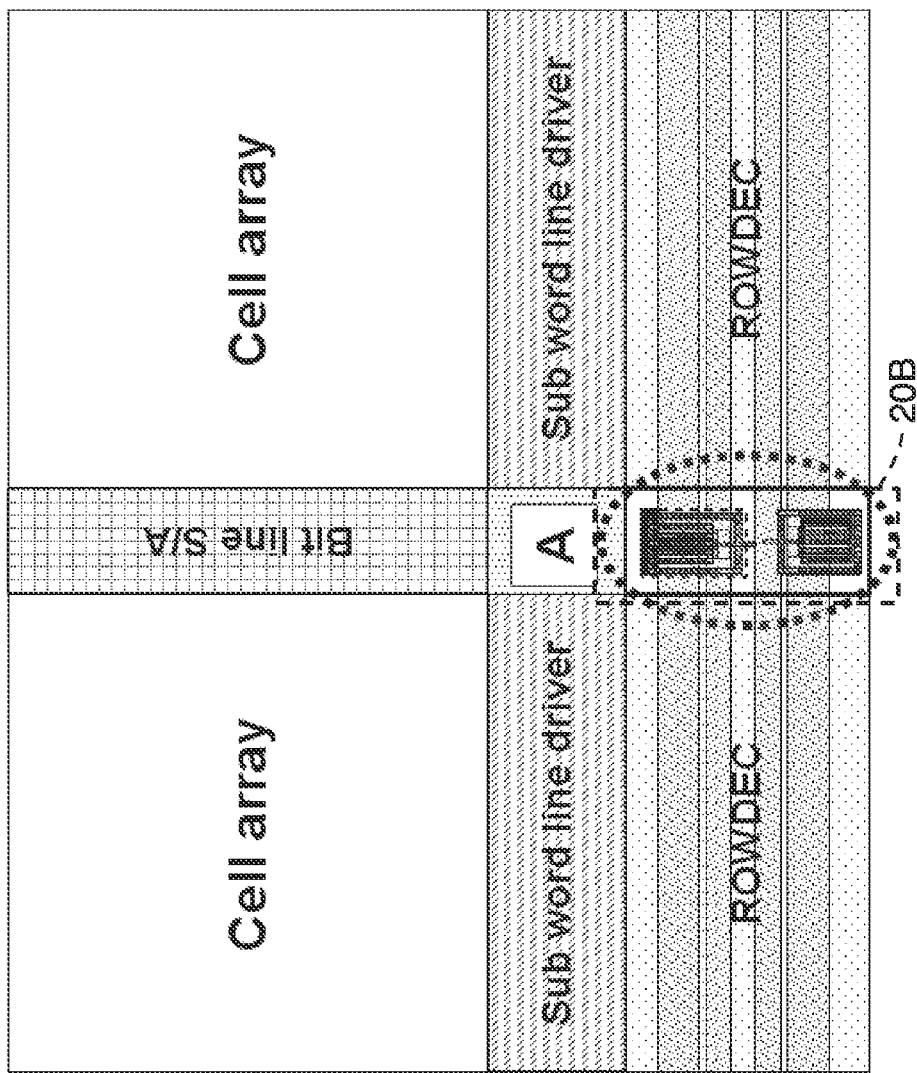

FIGS. 20A-20B illustrate an example layout embodiment of a z-logic row decoder within cell arrays. In this example the logic source transistors are placed in decoder holes (shown on path ROWDEC), with source transistors of bit line sense amplifiers placed in relation to bit line pairs, such as per each, per several, per block and so forth, or placed in an area crossed by sense amplifier area and sub-wordline driver, such as shown by area A. FIG. 20B again shown the bus areas, specifically $V_{SS}$, stdb, $V_{SZ}$, std and $V_{PP}$ are seen.

FIG. 21 depicts a first distribution type (shown as Normal distribution type) in relation to an NWELL, shown in dashed lines, near a P act and N act. P and N sense amplifier areas are also shown (P S/A and N S/A).

FIG. 22 illustrates an example embodiment of a z-logic distribution type with P sample amplifier (S/A) on a first side and N sample amplifier (S/A) on an opposing side (shown as P S/A and N S/A). Area of an N-well is shown surrounded by the dotted line on the left side. The source transistors can be placed in relation to the bit line pairs, such as per each, per several, per block and so forth, or may be placed in an area crossed by the sense amplifier area and sob-wordline driver. The ground source transistor for N S/A (e.g., PMOS transistor) is placed in an N well of P S/A, with the power source transistor shown of P S/A (e.g., NMOS transistor) placed in a P well of N S/A. Shown in the layout are P act areas and N act areas.

Figure 23:
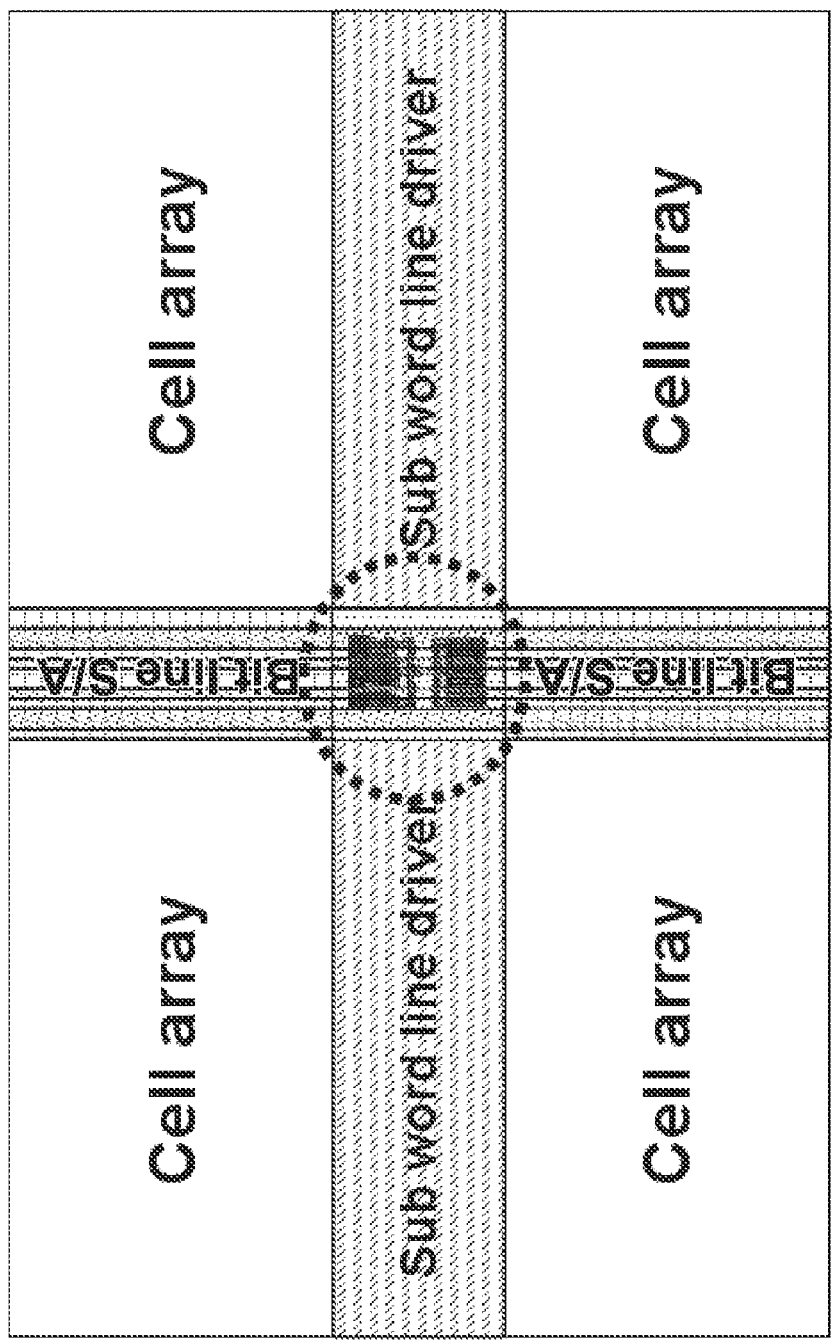
FIG. 23 is a layout of a driver located at a cross-over of a sub-word line driver and bit line S/A within a memory cell array.

FIG. 23 illustrates source transistor placement (dashed lines) in a cell array beneath the hole at a crossover between sub-word line drivers and bit line S/A paths.

6. Path Finder Source Transistor Checking.

A method is described for checking proper source transistor connection by assigning a known state other than $V_{DD}$ or $V_{SS}$ to the node where source transistor connects to the logic transistor and this known state is output at the logic output for a certain input state. By way of example the known state may be a Hi-z state, or a known state defined in standby mode. In one implementation the same type of source transistors are connected at every other logic gate.

According to one implementation the method includes pin property assignment, and port properties taken from the schematic itself, external text files or the port name.

In one implementation, a method is described to find a leakage path or circuit misconnection by comparing logic state on either side of the transmission gate.

A path finder method according to the present invention is described, which is referred to herein as z-technology. In using z-technology in a circuit whose standby status is already known by the designer, such as in DRAM circuits, the designer already knows the value of input/output ports and the value of internal nodes in blocks. In this case a zigzag style z-logic gate is utilized. By using zigzag style z-logic gates, all nodes must be set to their own standby value when the block is at standby mode. The leakage path occurrence condition can be found by running a simulator (i.e., Verilog simulation) with z-logic gates modeled as switch level.

Figure 25:
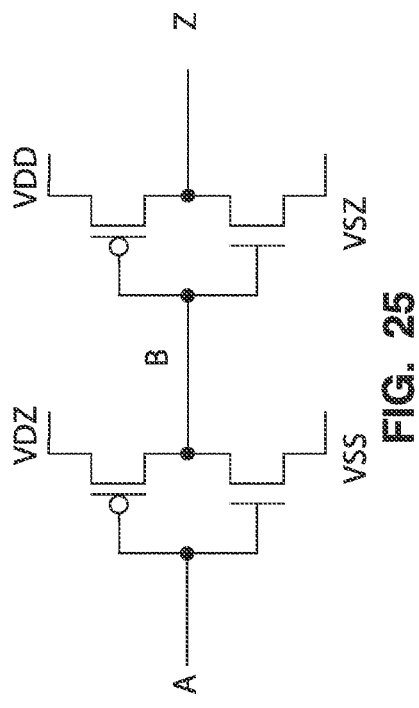
FIG. 25 is a schematic of a transistor level representation of the design shown in FIG. 24.
Figure 24:
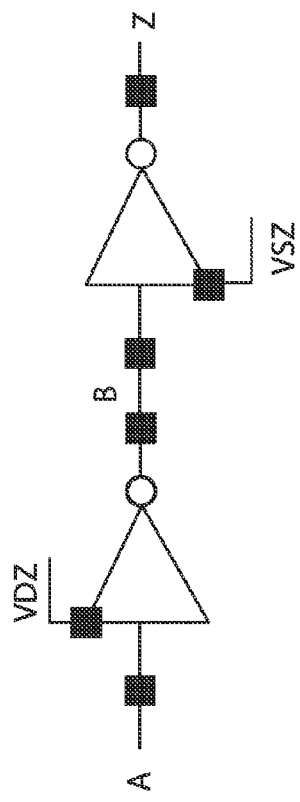
FIG. 24 is a schematic of a design represented using zigzag z-logic gates according to an aspect of the present invention.
Figure 27:
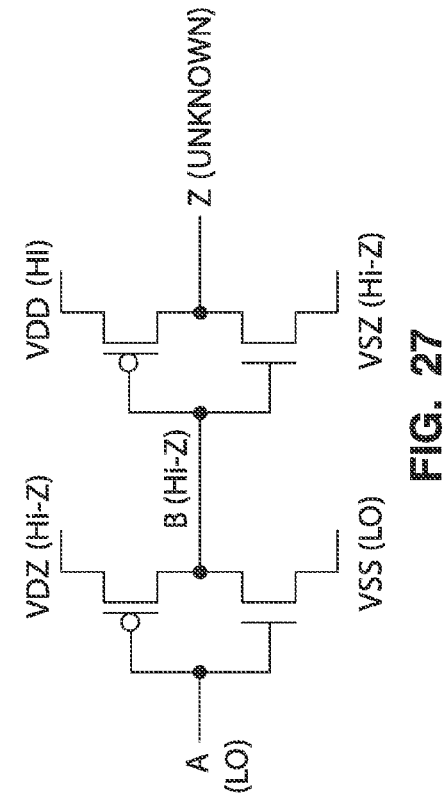
FIGS. 26-27 are schematic representations of good and bad standby mode configurations.
Figure 26:
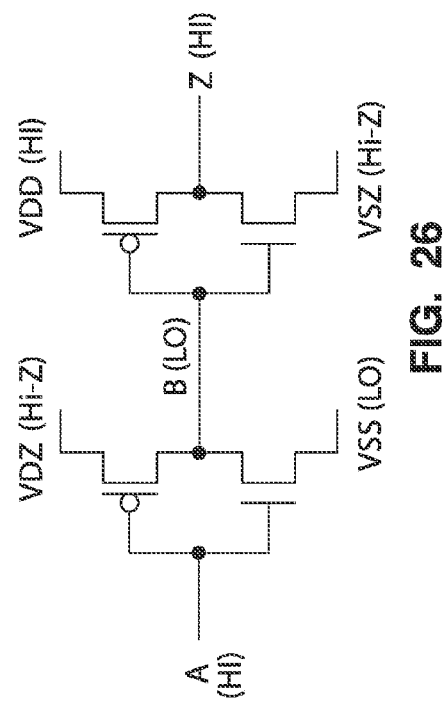

FIG. 24 illustrates an example design shown with the zigzag gates denoted with VDZ and VSZ on sequential gates. Port A is shown at the input, with port B between gates and output at port Z. FIG. 25 illustrates a transistor level schematic of the gates shown in FIG. 24, having ports A, B, and Z. First gate is supplied by VDZ and VSS, while the second gate is supplied by VDD and VSZ. FIG. 26 illustrates a suitable transistor configuration when in standby mode, shown with ports A, B and Z. In standby mode both VDZ and VSZ are depicted in hi-impedance mode (Hi-Z), with VDD being high and VSS being low. Port A is Hi, port B is low and port Z is Hi. FIG. 27, however, shows the same supply input states as in FIG. 26, represents a configuration that yields poor results when in standby mode. In FIG. 27 if input level of port A is low at standby mode, then the value of node B is Hi-Z and the value of port Z becomes unknown. In that instance, large leakage currents arise at unexpected leakage current paths. The path finder method according to the invention can detect improper configurations of zigzag style z-logic implementations in response to running a simulation, such as a Verilog simulation. In addition to checking leakage path when in standby mode, initial status (for example during power-up sequence) can be checked by similar methods. To use the path finder method, predefined information should be available on all input/output ports when in standby mode, and may comprise port properties in the schematic itself, external text files or the port name itself. Improper configurations can be checked in the block level by the path finder and can be readily checked in full chip level by conventional simulation (i.e., Verilog simulation) using a z-logic library set according to the invention. The z-logic library set also contains timing information of each gate for increased accuracy over the use of unit delay simulation.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A circuit device, comprising:
   a memory cell within a circuit device having multiple operating modes;
   said memory cell having a data state;
   at least one memory access transistor coupled to said memory;
   a sense amplifier for sensing the data state of said memory cell;
   bit lines coupling said at least one access transistor and said sense amplifier; and
   said memory access transistor configured, for memory cells which are not being accessed, with a gate-to-source potential that changes in response to the operating mode of said circuit device;
   wherein in normal operating mode said bit lines are driven to Vdd and Vss, while in self-refresh mode said bit lines are boosted to elevated voltages of Vddh and Vssh to change the gate-to-source potential of said memory access transistor.

2. A circuit device as recited in claim 1, wherein said memory cell comprises a dynamic random access memory (DRAM) within a plurality of DRAM memory cells having a memory state which is maintained in response to performing refresh operations.

3. A circuit device as recited in claim 1, wherein said gate-to-source potential of said memory cell comprises a source potential and a gate potential, wherein said source potential is higher than said gate potential.

4. A circuit device as recited in claim 3, wherein said source potential is higher than zero volts, or said gate potential is lower than zero volts, or said source potential is higher than zero volts and said gate potential is lower than zero volts.

5. A circuit device as recited in claim 1, further comprising a circuit which changes said gate-to-source potential in response to the state of data within said memory cell, whereby said circuit is responsive to memory cell state.

6. A circuit device as recited in claim 5, wherein said circuit comprises a bitline sense amplifier adapted to change gate-to-source potential in response to the state of data within said memory cell.

7. A circuit device as recited in claim 5, wherein:
   said circuit comprises a CMOS latch and a source transistor configured for changing gate-to-source potential in response to the state of data within said memory cell; and
   said source transistor comprises either a power source transistor or ground source transistor.

8. A circuit device as recited in claim 1, further comprising:
   a PMOS transistor as a ground source transistor which changes said gate-to-source potential in response to the state of data within said memory cell; and
   the source of said PMOS transistor is coupled to a common node of two NMOS transistors of a CMOS latch, and the drain of said PMOS transistor is connected to ground.

9. A circuit device as recited in claim 8, wherein gate potential of the PMOS transistor changes in response to operating mode.

10. A circuit device as recited in claim 9, wherein the gate potential of said PMOS transistor change is controlled in response to receiving a pulse signal.

11. A circuit device as recited in claim 9, wherein:
    said memory cell is a dynamic memory cell; and
    a gate potential of said PMOS transistor is lower than zero volts in normal operating mode, and said gate potential is zero volts in refresh mode.

12. A circuit device as recited in claim 11, wherein said refresh mode is controlled by a memory controller or memory device.

13. A circuit device as recited in claim 1, further comprising:
    an NMOS source transistor as a ground source transistor which changes said gate-to-source potential in response to reading the state of data within said memory cell; and
    the drain of said NMOS source transistor is coupled to a common node of two NMOS transistors of a CMOS latch, and the source of said NMOS source transistor is connected to ground.

14. A circuit device as recited in claim 13, wherein gate potential of said NMOS source transistor changes in response to operating mode of said circuit device.

15. A circuit device as recited in claim 14, wherein said gate potential of said NMOS source transistor is controlled by a pulse signal, or by a reference voltage through an error detector.

16. A circuit device as recited in claim 14, wherein:
    said memory cell is a dynamic memory cell; and
    a gate potential of said NMOS source transistor is lower in refresh mode than in normal operating mode.

17. A circuit device as recited in claim 16, wherein said refresh mode is controlled by a memory controller or memory device.

18. A circuit device as recited in claim 1, further comprising:
    a combination of PMOS and NMOS source transistors as a ground source transistor which changes said gate-to-source potential in response to reading the state of data within said memory cell;
    a source of said PMOS source transistor is connected to a common node of two NMOS transistors of a CMOS latch; and
    a drain of said NMOS source transistor is coupled to the common node of two NMOS transistors of a CMOS latch, and the source of said NMOS source transistor is connected to ground.

19. A circuit device as recited in claim 18, wherein gate potential of said PMOS and NMOS source transistors changes in response to operating mode of said circuit device.

20. A circuit device as recited in claim 19, wherein gate potential of said NMOS source transistor is controlled by a pulse signal.

21. A circuit device as recited in claim 18, wherein the turn-on time of said PMOS source transistor exceeds the turn-on time of said NMOS source transistor.

22. A circuit device as recited in claim 18, wherein:
said memory cell is a dynamic memory cell; and
a gate potential of said NMOS source transistor is lower in refresh mode than in normal operating mode.

23. A circuit device as recited in claim 22, wherein said refresh mode is controlled by a memory controller or memory device.

24. A circuit device as recited in claim 1, further comprising:
a circuit which changes said gate-to-source potential in response to reading the state of data within said memory cell;
said circuit comprises a CMOS latch and a ground source transistor; and
said memory cell is configured with two grounding paths, with a first path going to ground and a second path going to a potential above ground potential.

25. A circuit device as recited in claim 24, wherein said grounding path comprises:
a first grounding path having a first NMOS transistor with a drain coupled to a common node of two transistors of a CMOS latch, with the source of said first NMOS transistor coupled to ground;
a second grounding path which connects to a voltage potential higher than ground; and
said second grounding path having a second NMOS transistor with a drain connected to the common node of the two NMOS transistors of a CMOS latch, with the source of said second NMOS transistor connected to a node having a voltage potential higher than ground.

26. A circuit device as recited in claim 25, wherein the voltage potential higher than ground of said node is generated in response to a diode drop, or a voltage source.

27. A circuit device as recited in claim 26, wherein an NMOS or PMOS diode is used to generate said diode drop.

28. A circuit device as recited in claim 24, wherein the gate of said first NMOS transistor is controlled by a pulse signal.

29. A circuit device as recited in claim 24, wherein the turn-on time of said second NMOS transistor exceeds the turn-on time for said first NMOS transistor.

30. A circuit device as recited in claim 1, further comprising:
a circuit which changes said gate-to-source potential in response to reading the state of data within said memory cell;
said circuit comprises a CMOS latch and a power source transistor;
wherein said power source transistor comprises an NMOS source transistor; and
a source of said NMOS source transistor is connected to a common node of two PMOS transistors of a CMOS latch and the drain of said NMOS source transistor is connected to power.

31. A circuit device as recited in claim 30, wherein the gate potential of the NMOS source transistor changes in response to operating mode.

32. A circuit device as recited in claim 31, wherein the gate potential of said NMOS source transistor changes in response to receiving a pulse signal.

33. A circuit device as recited in claim 31, wherein:
said memory cell is a dynamic memory cell; and
the gate potential of said NMOS source transistor is higher than $V_{DD}$ in normal operating mode and is at $V_{DD}$ or lower while in refresh mode.

34. A circuit device as recited in claim 33, wherein said refresh mode is controlled by a memory controller or memory device.

35. A circuit device as recited in claim 1, further comprising:
a PMOS source transistor as a power source transistor which changes said gate-to-source potential in response to reading the state of data within said memory cell; and
a drain of said PMOS source transistor is coupled to the common node of two PMOS transistors of a CMOS latch, and the source of said PMOS source transistor is connected to power.

36. A circuit device as recited in claim 35, wherein the gate potential of the PMOS source transistor changes in response to operating mode changes.

37. A circuit device as recited in claim 36, wherein the gate potential of said PMOS source transistor is controlled by a pulse signal, or by a reference voltage through an error detector.

38. A circuit device as recited in claim 36, wherein the gate potential of said PMOS source transistor is higher in refresh mode than in normal operating mode.

39. A circuit device as recited in claim 38, wherein said refresh mode is controlled by a memory controller or memory device.

40. A circuit device as recited in claim 1, further comprising:
a combination of PMOS and NMOS source transistors as power source transistors which change said gate-to-source potential in response to reading the state of data within said memory cell;
a drain of said NMOS source transistor is coupled to a common mode of two PMOS transistors of a CMOS latch, and the drain of said NMOS source transistor is connected to power, and the drain of said PMOS source transistor is coupled to the common node of two PMOS transistors of a CMOS latch, and the source of said PMOS source transistor is connected to power.

41. A circuit device as recited in claim 40, wherein the gate potential of the combination of NMOS and PMOS source transistors, as power source transistors, changes in response to operating mode changes.

42. A circuit device as recited in claim 40, wherein the gate potential of said PMOS source transistor is controlled by a pulse signal.

43. A circuit device as recited in claim 40, wherein the turn-on time of said NMOS source transistor exceeds the turn-on time of said PMOS transistor.

44. A circuit device as recited in claim 1:
wherein a difference between gate-to-source potential can exist between said NMOS source transistor and said PMOS transistor;
wherein the difference in gate-to-source potential is controlled by a circuit that reads the cell data;
wherein the circuit is composed of a CMOS latch and source transistors which are either ground source transistors or power source transistors; and
wherein two power paths are supported, a first path going to a power potential and a second path going to a potential below power potential.

45. A circuit device as recited in claim 44, wherein said two power paths comprise:
- a first power path having a first PMOS source transistor whose drain is connected to a common node of two PMOS transistors of a CMOS latch, and the source of said first PMOS source transistor is connected to power;
- a second power path having a potential lower than power potential; and
- said second power path having a second PMOS source transistor whose drain is connected to the common node of two PMOS transistors of a CMOS latch and the source of the second PMOS source transistor connected to a certain node whose voltage is lower than power.

46. A circuit device as recited in claim 45, wherein said potential lower than power potential for said certain node is generated by a voltage source, or in response to a diode drop.

47. A circuit device as recited in claim 46, wherein an NMOS or PMOS diode is used to generate said diode drop.

48. A circuit device as recited in claim 44, wherein the gate potential of said PMOS source transistor is controlled by a pulse signal.

49. A circuit device as recited in claim 44, wherein the turn-on time of said second PMOS source transistor exceeds the turn-on time of said first PMOS source transistor.

50. A circuit device, comprising:
- a plurality of memory cells within a circuit device having multiple operating modes;
- said memory cells comprising dynamic random access memory (DRAM) each having a data state which is maintained in response to performing refresh operations;
- at least one memory access transistor coupled to said memory;
- a sense amplifier for sensing the data state of said memory cell;
- bit lines coupling said at least one access transistor and said sense amplifier; and
- said memory access transistor configured with a gate-to-source potential that changes in response to the operating mode of said circuit device for memory cells which are not being accessed;
- wherein said gate-to-source potential of said memory cell comprises a source potential and a gate potential, wherein said source potential is higher than said gate potential;
- wherein during normal operating mode said bit lines are driven to Vdd and Vss, while in self-refresh mode said bit lines are boosted to elevated voltages of Vddh and Vssh to change the gate-to-source potential of said memory access transistor.

51. A circuit device as recited in claim 50, wherein said source potential is higher than zero volts, or said gate potential is lower than zero volts, or said source potential is higher than zero volts and said gate potential is lower than zero volts.

52. A circuit device as recited in claim 50, further comprising a circuit which controls at least one source transistor to change said gate-to-source potential in response to data state within said memory cell, whereby said circuit is responsive to memory cell state.

53. A circuit device as recited in claim 50, further comprising:
- a PMOS transistor as a ground source transistor which changes said gate-to-source potential in response to data state within said memory cell; and
- the source of said PMOS transistor is coupled to a common node of two NMOS transistors of a CMOS latch, and the drain of said PMOS transistor is connected to ground.

54. A circuit device as recited in claim 50, further comprising:
- an NMOS source transistor as a ground source transistor which changes said gate-to-source potential in response to data state within said memory cell; and
- said NMOS source transistor having a drain coupled to a common node of two NMOS transistors of a CMOS latch, and the source of said NMOS source transistor is connected to ground.

55. A circuit device as recited in claim 50, further comprising:
- a combination of PMOS and NMOS source transistors as a ground source transistor which changes said gate-to-source potential responsive to data state within said memory cell;
- said PMOS source transistor having a source connected to a common node of two NMOS transistors of a CMOS latch; and
- said NMOS source transistor having a drain coupled to the common node of two NMOS transistors of a CMOS latch, and the source of said NMOS source transistor is connected to ground.

56. A circuit device as recited in claim 50, further comprising:
- a circuit which changes said gate-to-source potential responsive to data state within said memory cell;
- said circuit comprises a CMOS latch and a ground source transistor; and
- said memory cell is configured with two grounding paths, with a first path going to ground and a second path going to a potential above ground potential.

57. A circuit device as recited in claim 50, further comprising:
- a circuit which changes said gate-to-source potential responsive to data state within said memory cell;
- said circuit comprises a CMOS latch and a power source transistor;
- wherein said power source transistor comprises an NMOS source transistor; and
- a source of said NMOS source transistor is connected to a common node of two PMOS transistors of a CMOS latch and the drain of said NMOS source transistor is connected to power.

58. A circuit device as recited in claim 50, further comprising:
- a PMOS source transistor as a power source transistor which changes said gate-to-source potential responsive to data state within said memory cell; and
- a drain of said PMOS source transistor is coupled to the common node of two PMOS transistors of a CMOS latch, and the source of said PMOS source transistor is connected to power.

59. A circuit device as recited in claim 50, further comprising:
- a combination of PMOS and NMOS source transistors as power source transistors which change said gate-to-source potential responsive to data state within said memory cell;
- a drain of said NMOS source transistor is coupled to a common mode of two PMOS transistors of a CMOS latch, and the drain of said NMOS source transistor is connected to power, and the drain of said PMOS source transistor is coupled to the common node of two PMOS transistors of a CMOS latch, and the source of said PMOS source transistor is connected to power.

60. A circuit device as recited in claim 50, further comprising:
  wherein a difference between gate-to-source potential can exist between said NMOS source transistor and said PMOS transistor;
  wherein the difference in gate-to-source potential is controlled by a circuit that reads the cell data;
  wherein the circuit is composed of a CMOS latch and source transistors which are either ground source transistors or power source transistors; and
  wherein two power paths are supported, a first path going to a power potential and a second path going to a potential below power potential.

* * * * *